US012787748B2

(12) United States Patent
Choi et al.

(10) Patent No.: US 12,787,748 B2
(45) Date of Patent: Nov. 3, 2026

(54) INTEGRATED RING STRUCTURES

(71) Applicant: Intel Corporation, Santa Clara, CA (US)

(72) Inventors: June Choi, Portland, OR (US); Keith E. Zawadzki, Portland, OR (US); Kimberly L. Pierce, Beaverton, OR (US); Mohammad Enamul Kabir, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 142 days.

(21) Appl. No.: 17/974,945

(22) Filed: Oct. 27, 2022

(65) Prior Publication Data

US 2024/0145383 A1 May 2, 2024

(51) Int. Cl.
*H01L 23/48* (2006.01)
*H01L 23/52* (2006.01)
(Continued)

(52) U.S. Cl.
CPC .......... *H10W 20/43* (2026.01); *H10W 20/42* (2026.01); *H10W 20/4403* (2026.01)

(58) Field of Classification Search
CPC ............... H01L 23/528; H01L 23/5226; H01L 23/53209; H01L 25/0657; H01L 2224/08145; H01L 2224/0401; H01L 24/05; H01L 23/522; H01L 21/768; H01L 2224/16145; H01L 2224/32146; H01L 2224/32233; H01L 2224/48463; H01L 2225/06548; H01L 23/3107; H01L 25/0655; H01L 23/5386; H01L 2225/06517; H01L 23/3114; H01L 24/19; H01L 24/73; H01L 21/486; H01L 2224/08235; H01L 23/31;
(Continued)

(56) References Cited

U.S. PATENT DOCUMENTS 9,837,366 B1 12/2017 Liu et al.
2007/0090447 A1* 4/2007 Morimoto ............ H10W 20/01 257/E21.575
(Continued)

FOREIGN PATENT DOCUMENTS

CN 114823554 A * 7/2022 ............ H10W 90/00

OTHER PUBLICATIONS

Extended European Search Report received for EP Application No. 23199561.4, dated Feb. 14, 2024. 9 pages.

*Primary Examiner* — Niki H Nguyen
(74) *Attorney, Agent, or Firm* — Arcane Law PLLC

(57) ABSTRACT

An integrated circuit structure includes a device layer including a first set of devices and a second set of devices. An interconnect layer is above the device layer, where the interconnect layer includes one or more conductive interconnect features within dielectric material. In an example, a first ring structure including conductive material extends within the interconnect layer, and a second ring structure including conductive material extends within the interconnect layer. In an example, the second ring structure is non-overlapping with the first ring structure. In an example, the first ring structure is above the first set of devices of the device layer, and the second ring structure is above the second set of devices of the device layer.

20 Claims, 21 Drawing Sheets

(51) Int. Cl.

*H01L 29/40* (2006.01)
*H10W 20/42* (2026.01)
*H10W 20/43* (2026.01)
*H10W 20/44* (2026.01)

(58) Field of Classification Search

CPC . H01L 2224/05554; H01L 2224/05583; H01L 23/481; H01L 2224/02331; H01L 23/53295; H01L 24/08; H01L 2224/04042; H01L 21/76802; H01L 21/76877; H01L 2224/06051; H10D 30/024; H10D 30/6211; H10D 30/021; H10D 30/6735; H10D 30/6757; H10D 30/0281; H10D 84/0149; H10D 84/401; H10D 30/689; H10D 64/035; H10D 86/423

See application file for complete search history.

(56) References Cited

U.S. PATENT DOCUMENTS

| | | | | |
|---|---|---|---|---|
| 2009/0134500 | A1* | 5/2009 | Kuo | H10W 20/20 257/659 |
| 2010/0237472 | A1 | 9/2010 | Gillis et al. | |
| 2011/0057297 | A1* | 3/2011 | Lee | H10P 54/00 257/E23.179 |
| 2012/0112322 | A1* | 5/2012 | Lin | H10W 20/023 257/E29.022 |
| 2012/0175728 | A1* | 7/2012 | Yang | H10W 42/00 257/E21.24 |
| 2014/0035106 | A1 | 2/2014 | Vu et al. | |
| 2022/0102280 | A1 | 3/2022 | Dabral et al. | |
| 2022/0293433 | A1 | 9/2022 | Dabral et al. | |

* cited by examiner

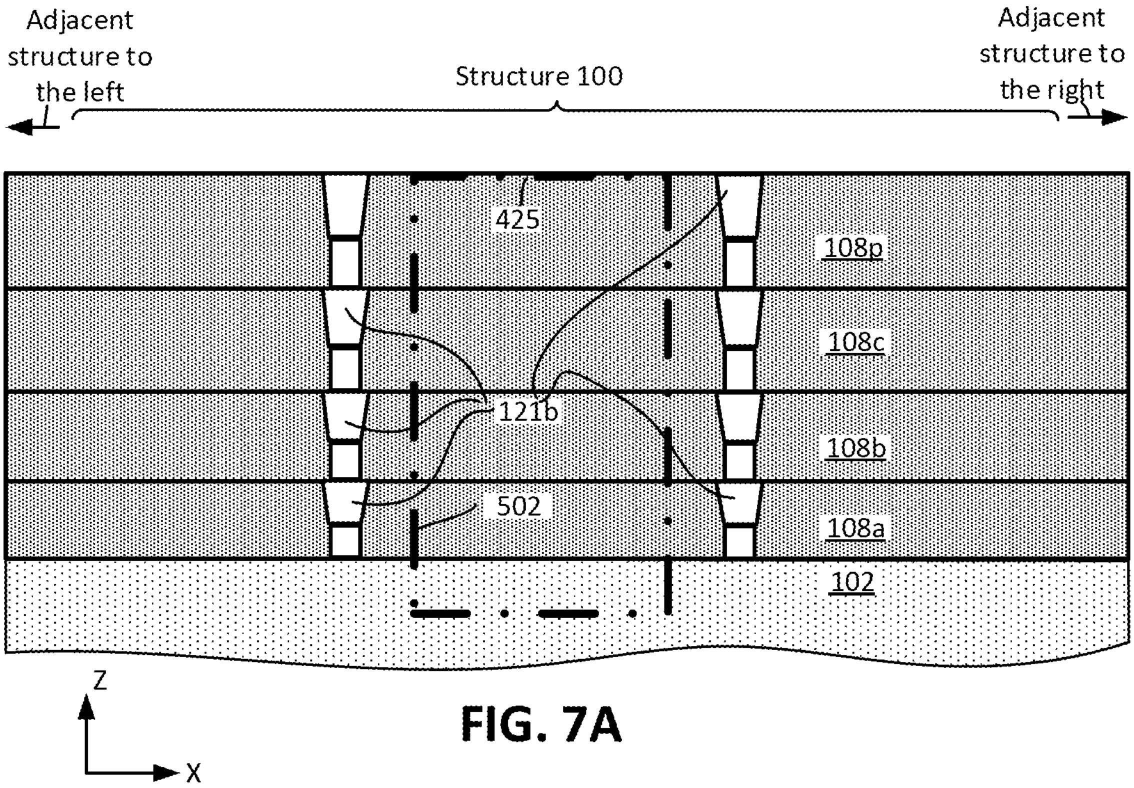
FIG. 7A
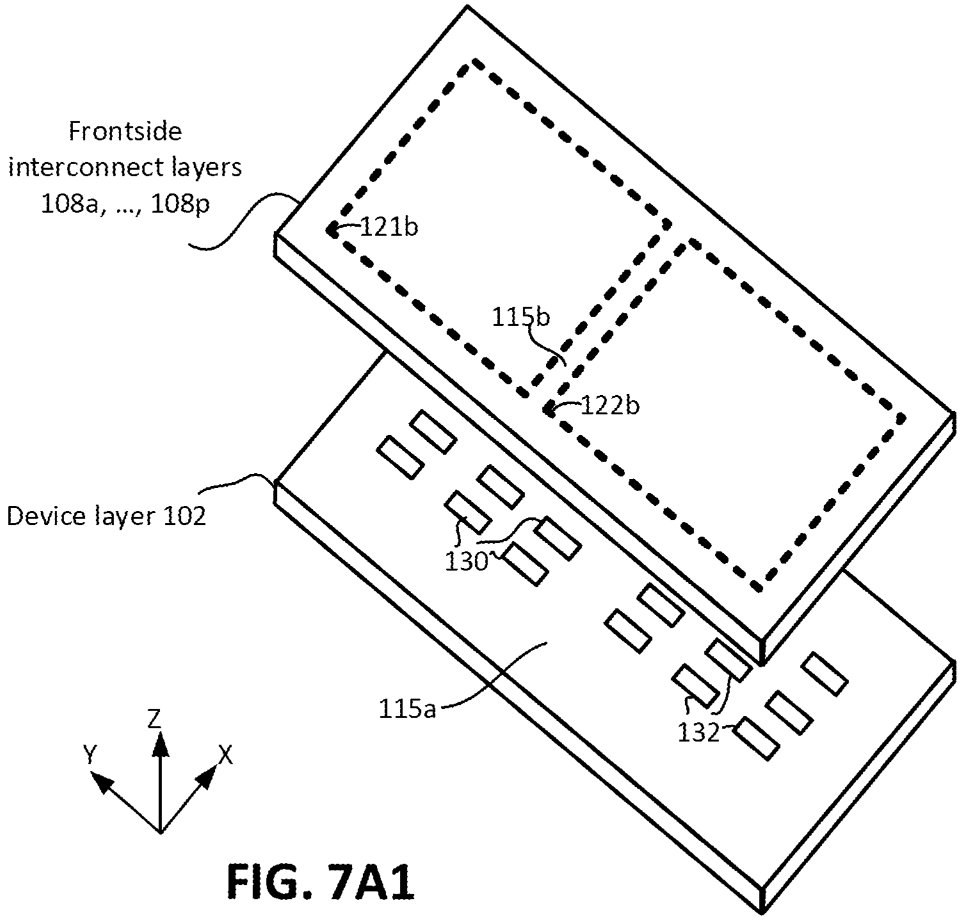
FIG. 7A1

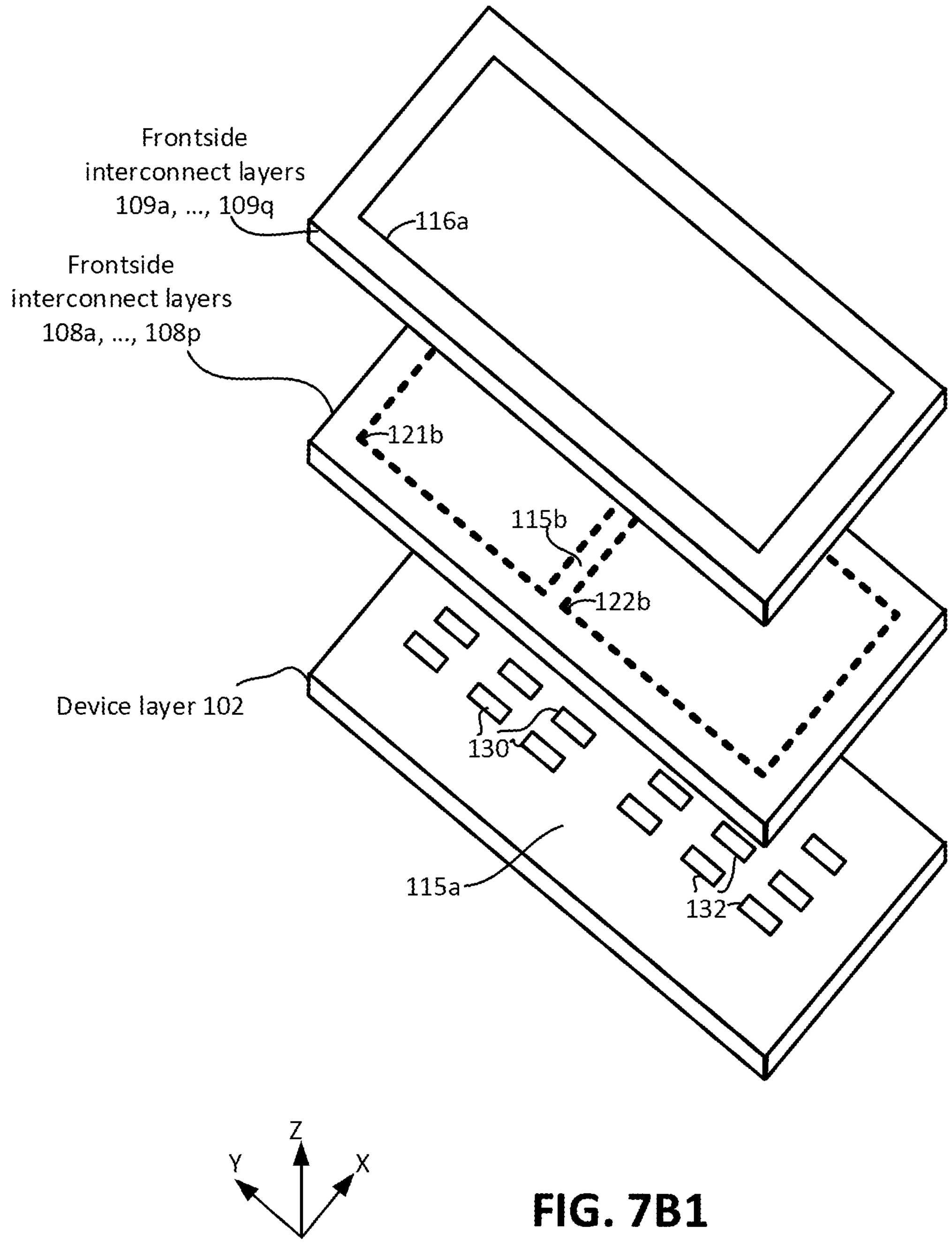
FIG. 7B1

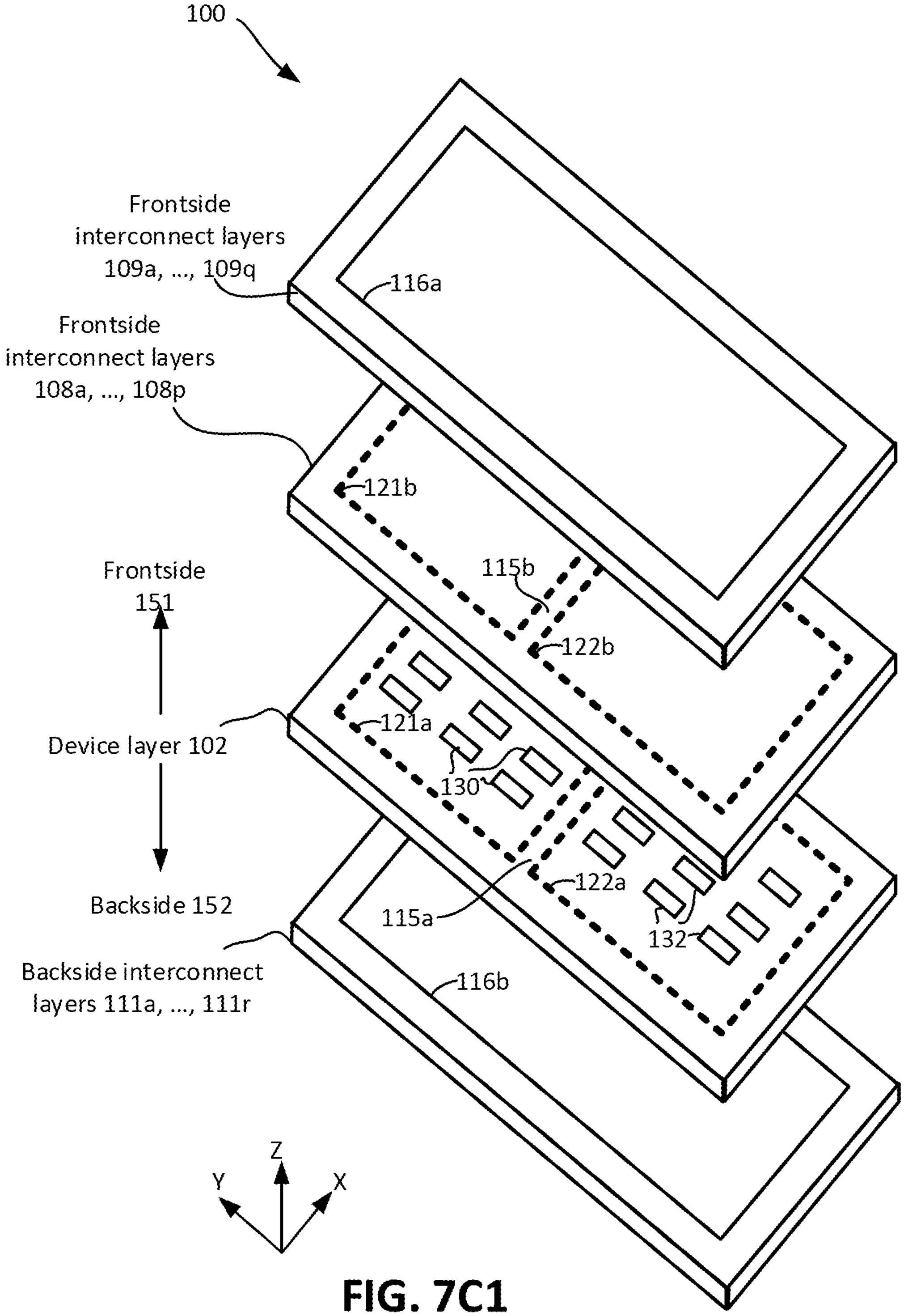
FIG. 7C1

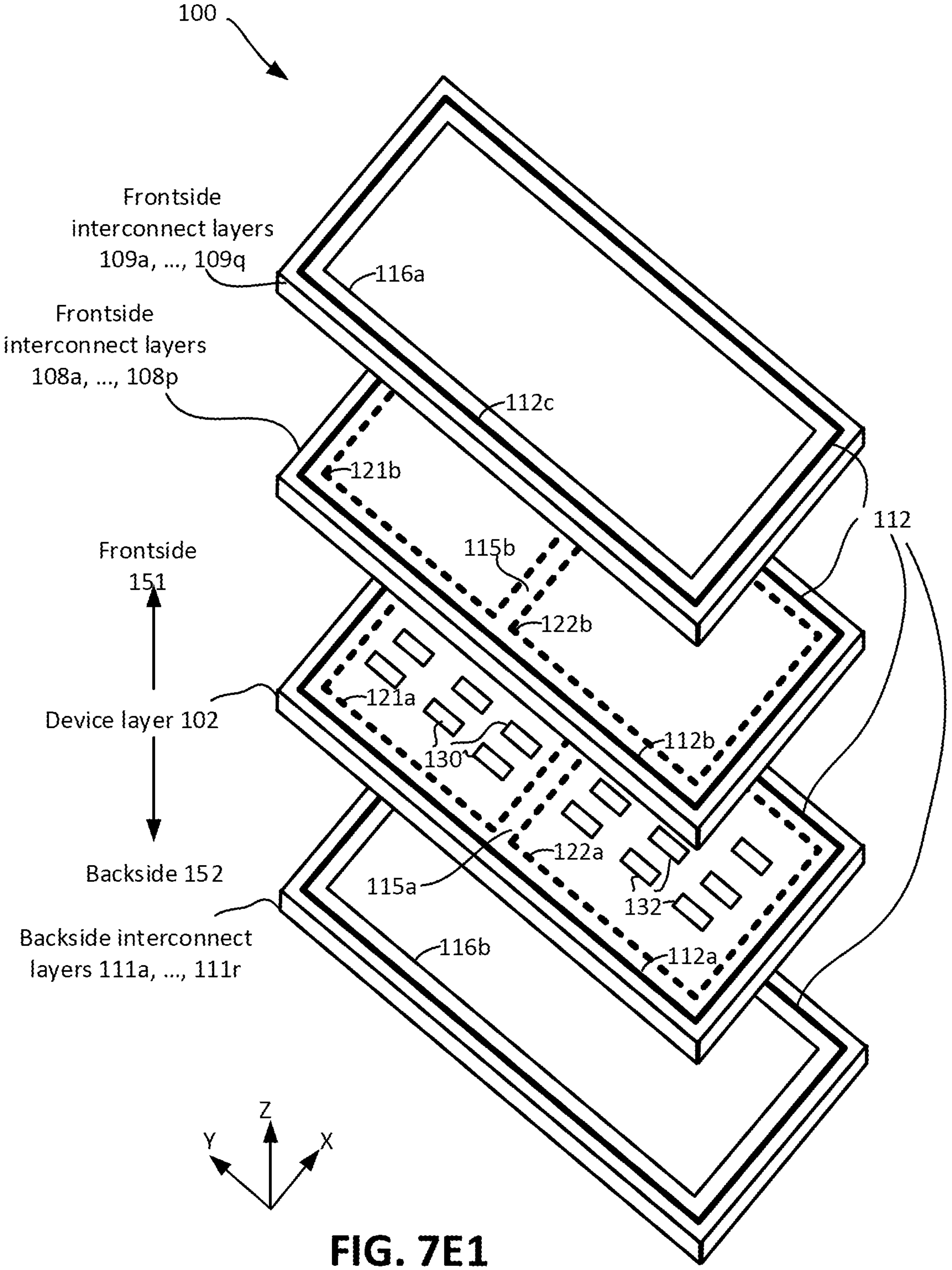
FIG. 7E1

INTEGRATED RING STRUCTURES

FIELD OF THE DISCLOSURE

The present disclosure relates to integrated circuits, and more particularly, to ring structures for integrated circuits, such as guard rings or etch rings.

BACKGROUND

As integrated circuits continue to scale downward in size, a number of challenges arise. For instance, components of an integrated circuit (such as one or more devices within a device layer, and/or interconnect features within one or more interconnect layers) are becoming smaller in size. Accordingly, high resolution optical lithography processes may be used to form such relatively fine featured components.

For example, optical lithography may be used in an etch process and/or layer formation process of an integrated circuit structure. In integrated circuit manufacturing, photolithography or optical lithography is used for techniques that use light to produce minutely patterned thin films of suitable materials over a substrate, such as a silicon wafer, to protect selected areas of the wafer during subsequent etching, deposition, or implantation operations. For example, ultraviolet light is used to transfer a geometric design from an optical mask to a light-sensitive chemical (e.g., photoresist) coated on the substrate. The photoresist either breaks down or hardens where it is exposed to light. The patterned film is then created by removing (e.g., etching) the softer parts of the coating with appropriate solvents. There remain a number of non-trivial challenges with respect to forming fine featured components of an integrated circuit structure using high resolution optical lithography processes.

BRIEF DESCRIPTION OF THE DRAWINGS

FIGS. 7A, 7A1, 7B, 7B1, 7C, 7C1, 7D, 7E, 7E1, 7F, and 7G collectively illustrate an example integrated circuit structure (e.g., the integrated circuit structure of FIGS. 1-5B) in various stages of processing in accordance with the methodology of FIG. 6, in accordance with an embodiment of the present disclosure.

Figure 1:
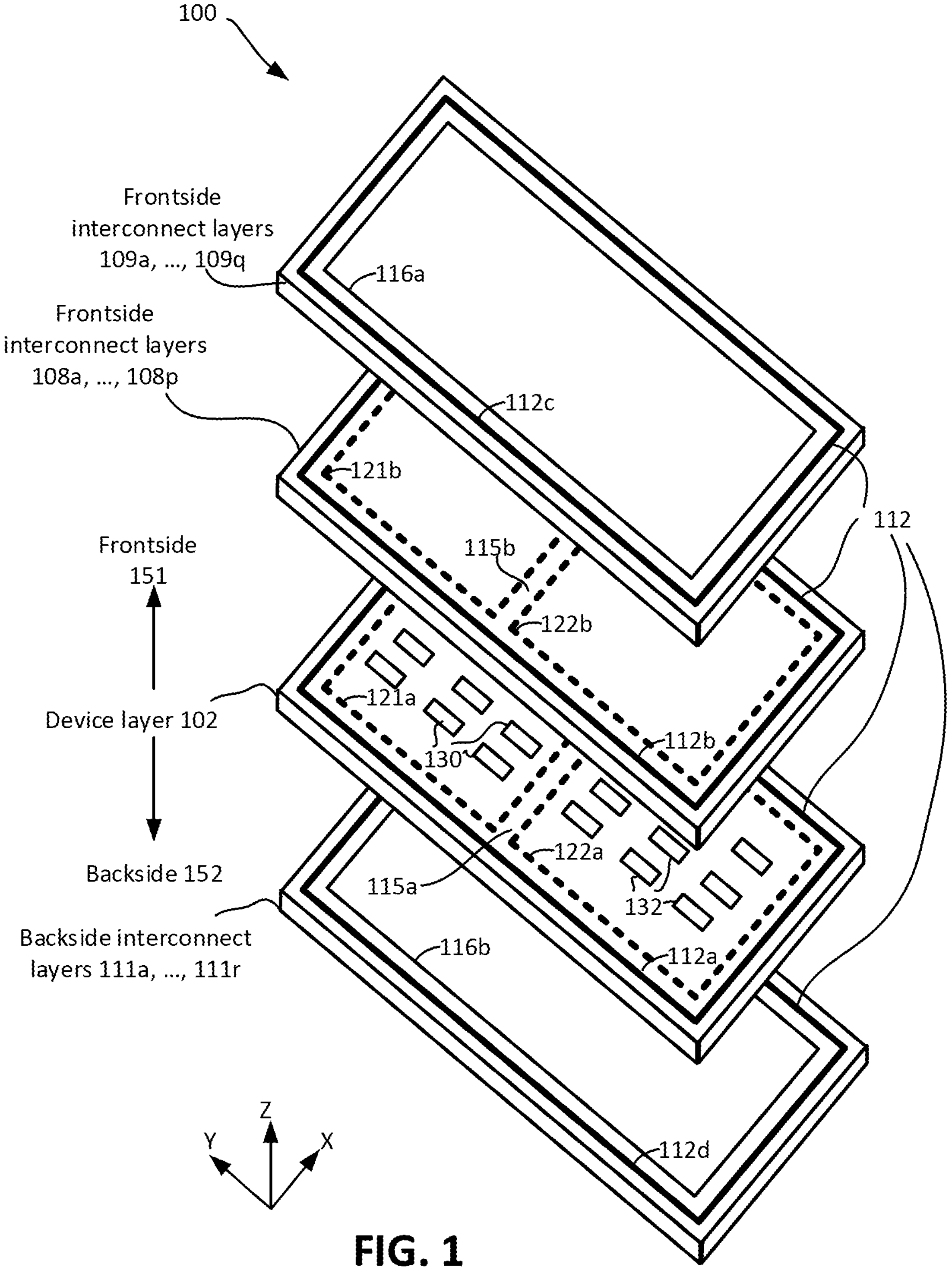
FIG. 1 is an exploded perspective view of an integrated circuit structure that includes (i) a device layer comprising a first set of devices and a second set of devices, (ii) first one or more frontside interconnect layers above the device layer, (iii) second one or more frontside interconnect layers above the first one or more frontside interconnect layers, (iv) a first conductive ring structure extending within the first one or more frontside interconnect layers, and (v) a second conductive ring structure extending within the first one or more frontside interconnect layers, wherein the first conductive ring structure is non-overlapping with the second conductive ring structure, wherein the first conductive ring structure is above the first set of devices of the device layer, and the second conductive ring structure is above the second set of devices of the device layer, in accordance with an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; same goes for other layer or feature dimensions.

DETAILED DESCRIPTION

Ring structures for integrated circuits, such as guard rings or etch rings, are described herein. In an example embodiment, an integrated circuit structure includes (i) a device layer, (ii) one or more lower frontside interconnect layers above the device layer, (iii) one or more upper frontside interconnect layers above the lower frontside interconnect layers, and (iv) one or more backside interconnect layers are described herein. In one such cases, each of the device layer and the lower frontside interconnect layer has at least two inner rings, whereas each of the upper frontside interconnect layers and the backside interconnect layers has a single inner ring. In some such embodiments, an outer ring extends within each of the device layer, the lower frontside interconnect layers, the upper frontside interconnect layers, and the backside interconnect layers, wherein the outer ring wraps around each of the inner rings described above. In an example, the inner and outer rings act as guard ring structures, e.g., to protect the components therewithin from external environment, such as humidity, and/or other chemical and/or physical hazards.

In another example embodiment, an integrated circuit structure comprises a device layer including a first set of devices and a second set of devices, and an interconnect layer above the device layer, where the interconnect layer comprises one or more conductive interconnect features within dielectric material. A first ring structure comprising conductive material extends within the interconnect layer, and a second ring structure comprising conductive material extends within the interconnect layer, where the second ring structure is non-overlapping with the first ring structure. In an example, the first ring structure is above the first set of devices of the device layer, and the second ring structure is above the second set of devices of the device layer.

In another example embodiment, an integrated circuit structure comprises a device layer including a set of devices, and an interconnect layer above the device layer, where the interconnect layer comprises one or more conductive interconnect features within dielectric material. A first ring structure comprising conductive material extends within the interconnect layer. In an example, the first ring structure does not extend within the device layer. In an example, the first ring structure is above the set of devices. A second ring structure comprising conductive material extends within the interconnect layer and the device layer.

In yet another example embodiment, an integrated circuit structure comprises a device layer including a set of devices, a frontside interconnect layer above the device layer, and a backside interconnect layer below the device layer. Each interconnect layer comprises one or more corresponding conductive interconnect features within dielectric material. In an example, a first ring structure comprising conductive material extends within the backside interconnect layer, without extending within the device layer or the frontside interconnect layer. In an example, a second ring structure comprising conductive material extends through each of the backside interconnect layer, the device layer, and the frontside interconnect layer. In an example, the second ring structure wraps around the first ring structure. Numerous configurations and variations will be apparent in light of this disclosure.

General Overview

As mentioned herein above, there remain a number of non-trivial challenges with respect to forming fine featured components of an integrated circuit structure using high resolution optical lithography processes. For example, the finer (e.g., smaller) the components to be formed by the optical lithography process, the higher may be the resolution requirement of the optical lithography process to form the components. Thus, in an example, high resolution optical lithography process results in smaller and higher resolution feature sizes. In optical lithography, a maximum field size that can be printed by a single exposure is determined by a type of illumination source, lens configuration, numerical aperture (NA), resolution of the features within the layer that are to be formed by the photolithography process, and so on. For example, to form relatively fine (e.g., high resolution) components within a layer of the integrated circuit structure, high resolution optical lithography process may be used, which may result in reduction of a maximum field size of the optical lithography process. Thus, higher resolution components could be achieved at the cost of a reduction in the field size. For example, a single optical lithography exposure may not cover an entirety of the die. So, for instance, when a product design is within the field size limit at a given lithography process, the die can be printed by one optical mask. However, if the product die-size exceeds the field dimensional limit, then the chip design may be split into two (or more) reticle fields, and printed separately. Because the chip design is split into two (or more) reticle fields and printed separately, a seam region may be formed within one or more layers of the integrated circuit, where no devices or conductive structures may be formed.

Accordingly, techniques are described herein to form integrated circuit structures having ring structures, such as guard rings or etch rings. In an example, an integrated circuit structure includes an outer ring structure extending within various layers (such as the device layer and the interconnect layers of the integrated circuit) of the integrated circuit, as well as one or more inner ring structures extending within corresponding individual layers of the integrated circuit. For example, a first layer, which has relatively high resolution features and which is split in two regions (where each region is printed using corresponding high resolution lithography processes), may have a first inner ring that wraps around a first of the two regions, and a second inner ring that wraps around a second of the two regions. However, a second layer, which has relatively low resolution features and need not be split in two regions, may have only one corresponding inner ring. The outer and inner rings may be guard rings or etch rings, and protect the components therewithin from external environment, such as humidity, and/or other chemical and/or physical hazards.

For example, assume a die having (i) a device layer, (ii) one or more lower frontside interconnect layers above the device layer, and (iii) one or more upper frontside interconnect layers above the lower frontside interconnect layers. Note that the lower and upper frontside interconnect layers are both frontside interconnect layers above the device layer. In an example, the lower frontside interconnect layers have interconnect features having relatively smaller (tighter) pitch, whereas the upper frontside interconnect layers have interconnect features having relatively larger (looser) pitch. Such interconnect features within the lower frontside interconnect layers are smaller than the interconnect features within the upper frontside interconnect layers. In an example where signals and/or power may be routed through the backside of the device layer, the die may also include one or more backside interconnect layers.

Thus, in an example, the devices of the device layer and the interconnect features of the lower frontside interconnect layers are relatively smaller, whereas the interconnect features of the upper frontside interconnect layers (and possibly the backside interconnect layers) are relatively larger. Accordingly, in an example, high resolution optical lithography processes may be employed to form the components (such as devices and interconnect features) of the device layer and the lower frontside interconnect layers. In an example, a high resolution optical lithography process may use, for example, a relatively high numerical aperture lens, and/or may use, for example, extreme ultraviolet for the lithography process. On the other hand, low resolution optical lithography process may be sufficient to form the components (such as interconnect features) of the upper frontside interconnect layers and the backside interconnect layers.

As also described herein above, due to limitations in the maximum field size of high resolution optical lithography process, one or more layers including smaller component size may be split into two (or more) reticle fields, and printed separately. Thus, each of the device layer and the lower frontside interconnect layers may be split in two (or more) reticle fields, and printed separately. In contrast, the upper frontside interconnect layers and the backside interconnect layers may be printed using low resolution optical lithography process, and may be printed without any such splitting.

In an example, due to splitting the formation process of the device layer and the lower frontside interconnect layers, there may be a "seam region", such as a "dead-zone", where no components may be formed within these layers. This seam region or dead-zone (e.g., seam regions 115*a*, 115*b* of FIG. 1) refers to an interface between the two above described split regions (note that the two split regions may not overlap, e.g., due to alignment issues). Thus, this seam region extending within each of the device layer and the lower frontside interconnect layers may lack any device or interconnect feature or any fine-printed component, e.g., due to lack of optical photolithography exposure in this seam region. Note that such seam region or dead-zone may be absent from the upper frontside interconnect layers and the backside interconnect layers, as described above.

In an example, a guard ring structure of an integrated circuit extends along a perimeter of the integrated circuit, e.g., forms a continuous wall of conductive material (such as metal, e.g., copper) along the perimeter of the integrated circuit. The guard ring, thus, forms a continuous wall around the components (such as devices of the device layer and the interconnect features of the interconnect layers), and can operate in conjunction with upper and lower layers (e.g., etch stop layers) to hermitically seal the integrated circuit area within the ring structure. For example, the guard ring protects the components therewithin from external environment, such as humidity, and/or other chemical and/or physical hazards. However, in an example, because of the limitations of the high resolution optical photolithography process, the guard ring cannot not be formed within the seam region or the dead-zone of the device layer and the lower frontside interconnect layers.

Thus, as described above, in an example, a first layer, which has higher resolution features and which is split in two regions (where each region is printed using corresponding high resolution lithography processes), may have a first inner ring that wraps around a first of the two regions, and a second inner ring that wraps around a second of the two regions. However, a second layer, which has lower resolution features and need not be split in two regions, may have only one corresponding inner ring. An outer ring extending within both the layers wraps around each of the inner rings. The outer and inner rings protect the components therewithin from external environment, such as humidity, and/or other chemical and/or physical hazards.

Note that the terms “ring structure” and “guard ring” and “etch ring” and more generally “ring” are herein used interchangeably, to describe a structure that is arranged in a continuous loop or wall to encircle or wrap around one or more components (such as devices and/or interconnect feature) therewithin, and that comprises conductive material. In a top down view, the ring may have any appropriate shape, as long as the ring is a continuous wall or body of material forming a loop, such that the ring can be used to hermitically seal components within the ring, in conjunction with other layers above and below the ring structure (e.g., an upper etch stop layer that abuts the top surface of the ring structure, and a lower etch stop layer that abuts the bottom surface of the ring structure). Thus, a ring helps protect components therewithin from external environment, such as humidity, chemicals, and/or other eternal factors. In a top-down view, a ring may have a rectangular shape (e.g., as illustrated in FIG. 1), a square shape, an oval shape, or another appropriate shape.

For example, as discussed above, each of the device layer and the lower frontside interconnect layer may have (i) a first region formed using first high resolution optical photolithography processes, (ii) a second region formed using second high resolution optical photolithography processes, and (iii) a seam region (or dead zone) between the first and second regions. In an example, a first inner ring surrounds the first region of each of the device layer and the lower frontside interconnect layer, and a second inner ring surrounds the second region of each of the device layer and the lower frontside interconnect layer. The seam region is between the first ring and the second ring.

For example, a portion of the first inner ring, which extends within the device layer, wraps around a first set of devices of the device layer. Similarly, a portion of the second inner ring, which extends within the device layer, wraps around a second set of devices of the device layer. Also, a portion of the first inner ring, which extends within the lower frontside interconnect layers, is above the first set of devices of the device layer. Similarly, a portion of the second inner ring, which extends within the lower frontside interconnect layers, is above the second set of devices of the device layer.

Note that the upper frontside interconnect layers and the backside interconnect layers do not have any such seam region. Accordingly, a single inner ring extends within each of the upper frontside interconnect layers, and similarly, a single inner ring extends within each of the backside interconnect layers. Thus, each of the device layer and the lower frontside interconnect layer has two inner rings, whereas each of the upper frontside interconnect layers and the backside interconnect layers has a single inner ring.

In one embodiment, an outer ring structure extends within each layer of the integrated circuit, such as extends within each of the device layer, the lower frontside interconnect layers, the upper frontside interconnect layers, and the backside interconnect layers. The outer ring wraps around each of the first and second inner rings of the device layer and the lower frontside interconnect layer, as well as the single inner ring of the upper frontside interconnect layers and the backside interconnect layers.

In an example, the outer ring is formed subsequent to forming (i) the device layer, (ii) the lower frontside interconnect layers, (iii) the upper frontside interconnect layers, (iv) the backside interconnect layers, and (v) the various inner rings. For example, the outer ring is formed prior to dicing the die from the wafer. Accordingly, in an example, a low resolution optical lithography process may be employed to form the outer ring. Accordingly, the low resolution optical lithography process may cover the entire die, and hence, the outer ring is along a perimeter of the entire die.

In one embodiment, the outer ring acts as a guard ring, e.g., protects the components therewithin from external environment, such as humidity and/or other chemical and/or physical hazards. In one embodiment, the various inner ring may also act as guard rings, and may protect the components therewithin from external environment during formation of the outer ring. For example, as the outer ring has to extend through all layers of the integrated circuit and may be relatively thick, the process to form the outer ring may be chemically harsh on the components within the integrated circuit. Accordingly, the various inner rings protect components therewithin from the outer ring formation process, in an example.

The use of “group IV semiconductor material” (or “group IV material” or generally, “IV”) herein includes at least one group IV element (e.g., silicon, germanium, carbon, tin), such as silicon (Si), germanium (Ge), silicon-germanium (SiGe), and so forth. The use of “group III-V semiconductor material” (or “group III-V material” or generally, “III-V”) herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are “compositionally different” or “compositionally distinct” as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

It should be readily understood that the meaning of "above" and "over" in the present disclosure should be interpreted in the broadest manner such that "above" and "over" not only mean "directly on" something but also include the meaning of over something with an intermediate feature or a layer therebetween. As used herein, the term "backside" generally refers to the area beneath one or more semiconductor devices (below the device layer) either within the device substrate or in the region of the device substrate (in the case where the bulk of the device substrate has been removed). Note that the backside may become a frontside, and vice-versa, if a given structure is flipped. To this end, and as will be appreciated, the use of terms like "above" "below" "beneath" "upper" "lower" "top" and "bottom" are used to facilitate discussion and are not intended to implicate a rigid structure or fixed orientation; rather such terms merely indicate spatial relationships when the structure is in a given orientation.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For example, in some embodiments, such tools may be used to detect an integrated circuit structure comprising (i) a device layer, (ii) one or more lower frontside interconnect layers above the device layer, (iii) one or more upper frontside interconnect layers above the lower frontside interconnect layers, and (iv) one or more backside interconnect layers, where each of the device layer and the lower frontside interconnect layer has two inner rings, whereas each of the upper frontside interconnect layers and the backside interconnect layers has a single inner ring. In some embodiments, such tools may be used to detect an outer ring extending within each of the device layer, the lower frontside interconnect layers, the upper frontside interconnect layers, and the backside interconnect layers, wherein the outer ring wraps around each of the inner rings described above. Numerous configurations and variations will be apparent in light of this disclosure.

Architecture

FIG. 1 is an exploded perspective view of an integrated circuit structure 100 that includes (i) a device layer 102 comprising a first set of devices 130 and a second set of devices 132, (ii) first one or more frontside interconnect layers 108*a*, . . . , 108*p* above the device layer, (iii) second one or more frontside interconnect layers 109*a*, . . . , 109*q* above the first one or more frontside interconnect layers 108*a*, . . . , 108*p*, (iv) a first conductive ring structure 121*b* extending within the first one or more frontside interconnect layers 108*a*, . . . , 108*p*, and (v) a second conductive ring structure 122*b* extending within the first one or more frontside interconnect layers 108*a*, . . . , 108*p*, wherein the first conductive ring structure 121*b* is non-overlapping with the second conductive ring structure 122*b*, wherein the first conductive ring structure 121*b* is above the first set of devices 130 of the device layer 102, and the second conductive ring structure 122*b* is above the second set of devices 132 of the device layer 102, in accordance with an embodiment of the present disclosure.

Note that FIG. 1 illustrates the exploded view of the integrated circuit structure 100 (also referred to herein as structure 100). Accordingly, although a gap is shown between, for example, the device layer 102 and the frontside interconnect layers 108*a*, . . . , 108*p* (generally referred to herein as interconnect layers 108), the frontside interconnect layers 108 are on the device layer 102. Similarly, the second one or more frontside interconnect layers 109*a*, . . . , 109*q* (generally referred to herein as interconnect layers 109) are on the first one or more frontside interconnect layers 108*a*, . . . , 108*p*.

Note that the terms "ring structure" and "ring" are used herein to describe a structure that is arranged in a continuous loop to encircle or wrap around one or more components (such as devices and/or interconnect feature) therewithin, and that comprises conductive material. In a top down view, the ring may have any appropriate shape, as long as the ring is a continuous wall or body of material forming a loop, such that the ring hermitically seals components within the ring. Thus, a ring protects components therewithin from external environment, such as humidity, chemicals, and/or other eternal factors. In a top-down view, a ring may have a rectangular shape (e.g., as illustrated in FIG. 1), a square shape, an oval shape, or another appropriate shape.

Note that in the orientation of FIG. 1, a frontside 151 of the structure 100 is above the device layer 102, and a backside 152 of the structure 100 is below the device layer 102. Accordingly, the interconnect layers 108, 109 are frontside interconnect layers and are above the device layer 102. Also illustrated in the exploded perspective view of FIG. 1 are backside interconnect layers 111*a*, . . . , 111*r*

(generally referred to herein as interconnect layers 111) that are on a backside of the structure 100, e.g., below the device layer 102.

Referring to the frontside interconnect layers 108*a*, . . . , 108*p*, as illustrated, a conductive ring structure 121*b* (also referred to simply as ring 121*b*) extends through each of the interconnect layers 108*a*, 108*b*, 108*p*, and so on. The ring 121*b* is illustrated using dotted line in FIG. 1. For example, the ring 121*b* forms a vertical wall of conductive material that extends through each of the interconnect layers 108*a*, 108*b*, 108*p*. The actual structure of individual rings will be discussed herein later.

Similarly, another conductive ring structure 122*b* (also referred to simply as ring 122*b*) extends through each of the interconnect layers 108*a*, 108*b*, 108*p*. The ring 122*b* is illustrated using dotted line in FIG. 1. For example, the ring 122*b* forms a vertical wall of conductive material that extends through each of the interconnect layers 108*a*, 108*b*, 108*p*.

Now referring to the device layer 102, a conductive ring structure 121*a* (also referred to simply as ring 121*a*) extends through the device layer 102, and encircles or wraps around the devices 130. The ring 121*a* is illustrated using dotted line in FIG. 1. For example, the ring 121*a* forms a vertical wall of conductive material that extends through the device layer 102.

Similarly, a conductive ring structure 122*a* (also referred to simply as ring 122*a*) extends through the device layer 102, and encircles or wraps around the devices 132. The ring 122*a* is illustrated using dotted line in FIG. 1. For example, the ring 122*a* forms a vertical wall of conductive material that extends through the device layer 102.

As illustrated, in an example, the ring 121*b* is above, and substantially aligned to, the ring 121*a*, and the rings 121*a*, 121*b*, in combination, form a continuous ring 121 (see FIGS. 2A-2C) that extends through the device layer 102 and the interconnect layers 108*a*, . . . , 108*p*. For example, the combined ring 121 comprises a vertical wall of conductive material that extends through the device layer 102 and the interconnect layers 108*a*, . . . , 108*p*. Note that the combined ring 121 doesn't extend from the interconnect layers 109 or 111.

Similarly, in an example, the ring 122*b* is above the ring 122*a*, and the rings 122*a*, 122*b*, in combination, form a continuous ring 122 (see FIGS. 2A-2C) that extends through the device layer 102 and the interconnect layers 108*a*, . . . , 108*p*. For example, the combined ring 122 comprises a vertical wall of conductive material that extends through the device layer 102 and the interconnect layers 108*a*, . . . , 108*p*. Note that the combined ring 122 doesn't extend from the interconnect layers 109 or 111.

Note that each of the rings 121, 122 (as well as below discussed rings 112, 116) is formed in a continuous loop. The rings, along with various etch stop layers 425 (discussed herein later), hermitically seals components that are within the corresponding ring. For example, the ring 121*a* is formed in a continuous loop around the devices 130, such that the ring 121*a* forms a continuous wall around the devices 130. Ring 121*a*, along with an upper etch stop layer 425 (see FIGS. 4 and 5) that abuts a top surface of the ring 121*a* and a bottom etch stop layer 425 that abuts a bottom surface of the ring 121*a*, hermitically seals the devices 130.

As illustrated, the ring 121 (which is a combination of ring 121*a* extending through the device layer 102 and ring 121*b* extending through the interconnect layers 108) extends through, and is confined within, the device layer 102 and interconnect layer 108. For example, the ring 121 does not extend within any of the interconnect layers 109*a*, . . . , 109*q* or the interconnect layers 111*a*, . . . , 111*r*.

Similarly, the ring 122 (which is a combination of ring 122*a* extending through the device layer 102 and ring 122*b* extending through the interconnect layers 108) extends through, and is confined within, the device layer 102 and interconnect layer 108. For example, the ring 122 does not extend within any of the interconnect layers 109*a*, . . . , 109*q* or the interconnect layers 111*a*, . . . , 111*r*.

Now referring to the interconnect layers 109*a*, . . . , 109*q* that are above the interconnect layers 108*a*, . . . , 108*p*, a conductive ring structure 116*a* (also referred to simply as ring 116*a*) extends within each of the interconnect layers 109*a*, . . . , 109*q*, e.g., forms a continuous vertical wall of conductive material within each of the interconnect layers 109*a*, . . . , 109*q*. In an example, the ring 116*a* is above both the sets of devices 130, 132. For example, for individual ones of the interconnect layers 109*a*, . . . , 109*q*, the ring 116*a* is arranged near a periphery or circumference of the structure 100. In an example, the ring 116*a* is at least in part above each of the rings 121 and 122.

Now referring to the backside interconnect layers 11*a*, . . . , 111*r*, a conductive ring structure 116*b* (also referred to simply as ring 116*b*) extends within each of the interconnect layers 111*a*, . . . , 111*r*, e.g., forms a continuous vertical wall of conductive material within each of the interconnect layers 111*a*, . . . , 111*r*. In an example, the ring 116*b* is below both the sets of devices 130, 132. For example, the ring 116*b* is arranged near a periphery or circumference of individual ones of the interconnect layers 111*a*, . . . , 111*r*. In an example, the ring 116*b* is at least in part below each of the rings 121 and 122.

In an example, the ring 116*a* and the ring 116*b* are substantially aligned, as will be discussed herein later. In an example, the ring 116*a* and the ring 116*b*, in combination, is referred to herein as ring 116. Note that the combined ring 116 is discontinuous, e.g., comprises an upper ring 116*a* and a lower ring 116*b*, where the upper and lower rings 116*a* and 116*b* are separated by the device layer 102 and the interconnect layers 108, and where the upper ring 116*a* and the lower ring 116*b* may be substantially aligned (or may not be aligned), as illustrated in FIG. 1.

In one embodiment, the structure 100 further comprises a conductive ring structure 112 (also referred to simply as ring 112) that extends within each of the interconnect layers 111*a*, . . . , 111*r*, 108*a*, . . . , 108*p*, 109*a*, . . . , 109*q*, and the device layer 102. For example, the ring 112 forms a continuous vertical wall of conductive material within each of the interconnect layers 111, 108, 109, as well as the device layer 102. For example, the ring 112 is arranged near a periphery or circumference of the structure 100.

As illustrated, the devices 130, 132, as well as the rings 121, 122, 116 are within the ring 112. Thus, the ring 112 encircles or wraps around each of the devices 130, 132, as well as the rings 121, 122, 116. Accordingly, the ring 112 may be considered as an "outer ring" of the device 100, whereas the rings 116, 121, 122 may be considered as "inner rings" of the device 100.

Figure 2A:
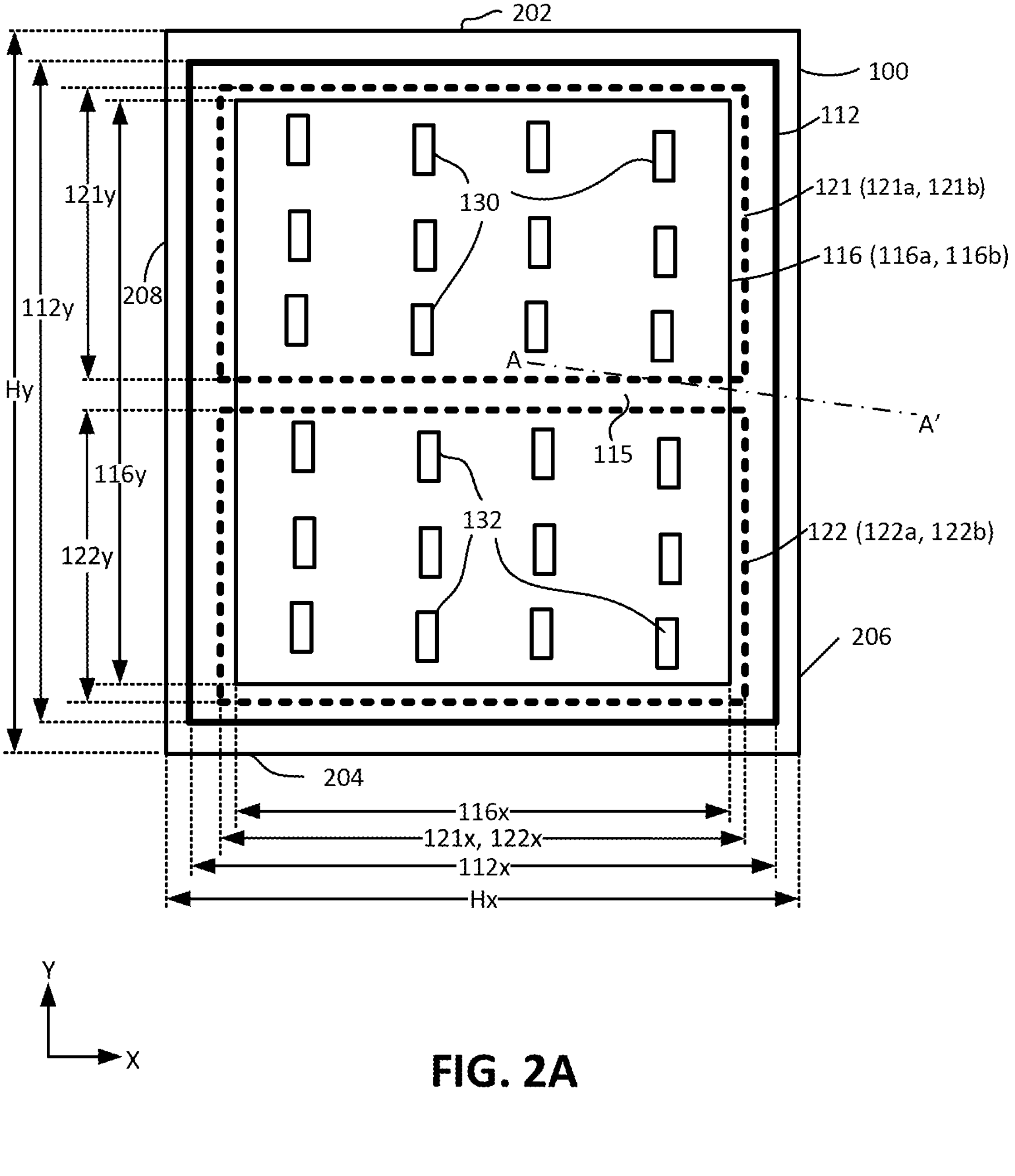
FIGS. 2A, 2B, 2C illustrate example top views of the structure of FIG. 1, and illustrate various example alignments of a first inner ring with respect to a second inner ring and a third inner ring, in accordance with an embodiment of the present disclosure.
Figure 2B:
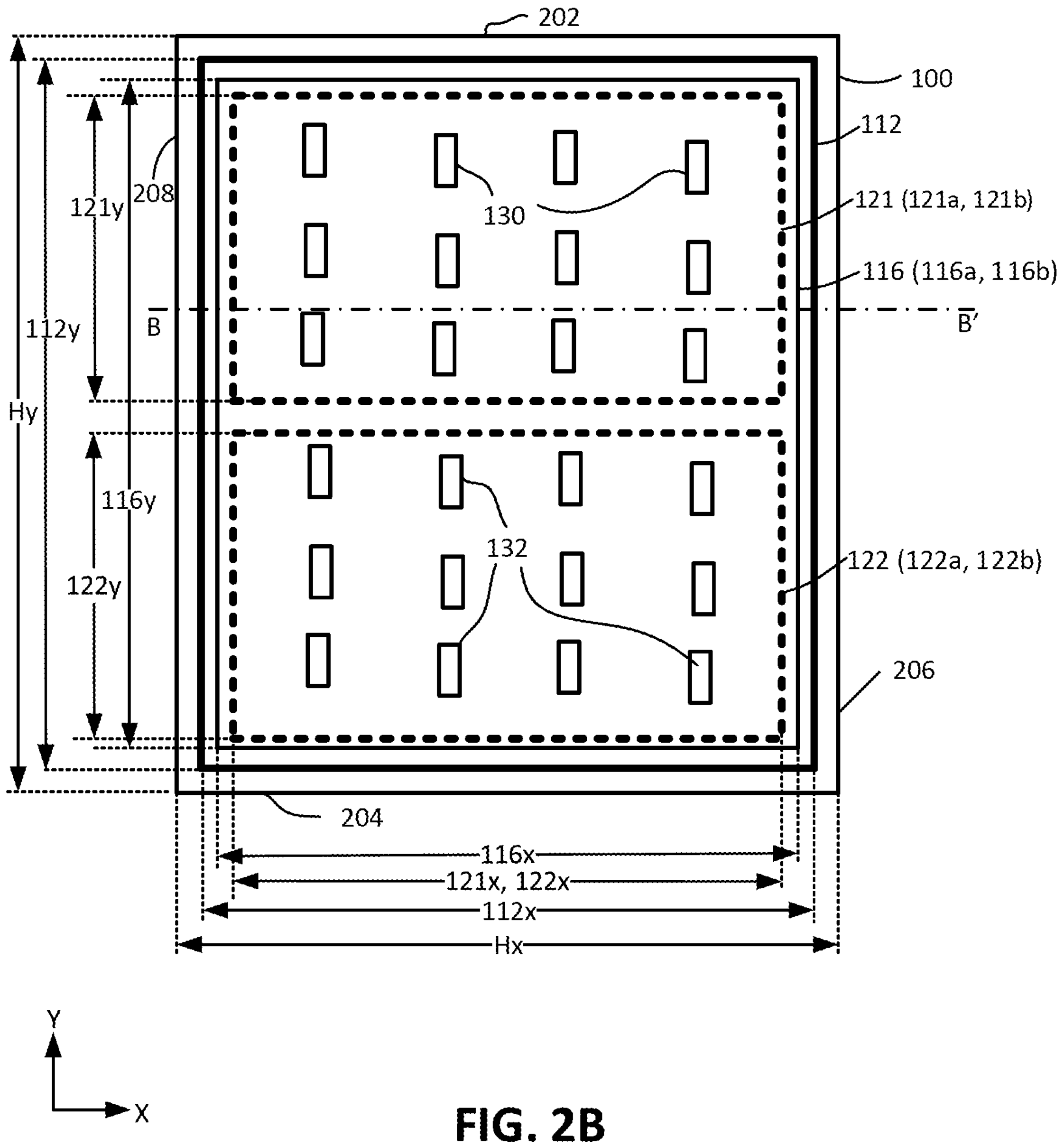
Figure 2C:
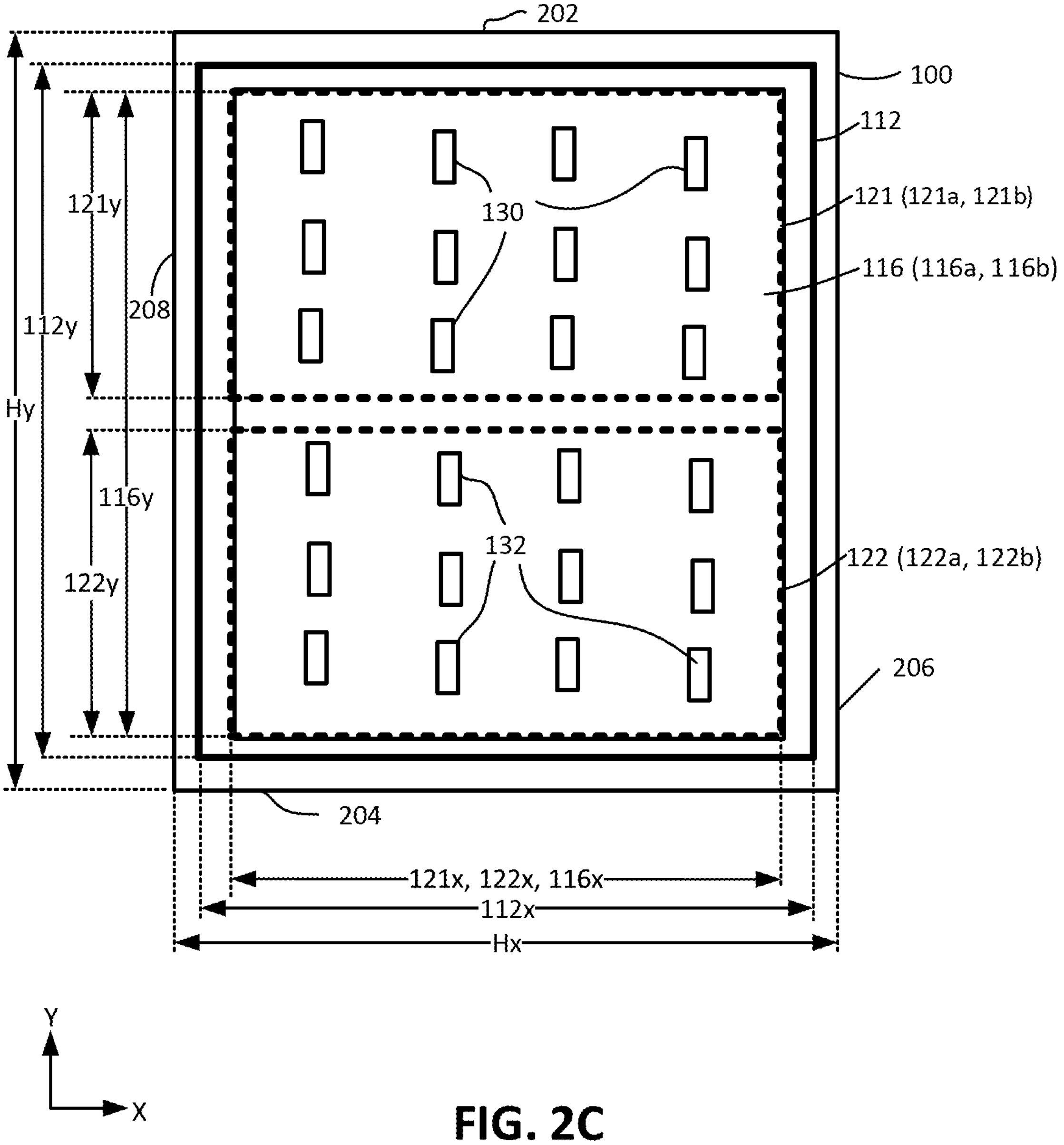

FIGS. 2A, 2B, 2C illustrate example top views of the structure 100 of FIG. 1, and illustrate various example alignments of a first inner ring 116 with respect to a second inner ring 121 and a third inner ring 122, in accordance with an embodiment of the present disclosure. FIGS. 2A-2C illustrate three example alignments of the ring 116 with respect to rings 121, 122, although any other possible alignments may also be possible.

For example, in the top view of each of FIG. 2A-2C, four edges 202, 204, 206, and 208 of the structure 100 are labelled, where the edges 202 and 204 extend along the X-axis direction, and the edges 206 and 208 extend along the Y-axis direction.

In each of FIG. 2A-2C, dimensions of the structure 100 along with X-axis direction and the Y-axis direction are Hx and Hy, respectively. Dimensions of the outer ring 112 along with X-axis direction and the Y-axis direction are 112*x* and 112*y*, respectively.

Note that in the top down view, it is assumed that the rings 121*a* and 121*b* are combined to form a single ring 121, and similarly, the rings 122*a* and 122*b* are combined to form a single ring 122. Accordingly, the rings 121 and 122 are illustrated in FIGS. 2A-2C.

Dimensions of the inner ring 121 along with X-axis direction and the Y-axis direction are 121*x* and 121*y*, respectively. Dimensions of the inner ring 122 along with X-axis direction and the Y-axis direction are 122*x* and 122*y*, respectively. Note that in the example of FIGS. 2A-2C, 121*x* and 122*x* are substantially equal (e.g., differs by at most 1 nm or 2 nm). Dimensions of the inner ring 116 (e.g., comprising two discontinuous and aligned rings 116*a* and 116*b*) along with X-axis direction and the Y-axis direction are 116*x* and 116*y*, respectively.

Thus, as illustrated, the rings 121 and 122 are laterally arranged (e.g., arranged in a side-by-side manner) in the Y-axis direction. Accordingly, 116*x* differs slightly from each of 121*x* and 122*x*, e.g., differs by at most 1 nm, or at most 2 nm, or at most 3 nm, or at most 5 nm, or at most 10 nm, or at most 20 nm, or at most 50 nm, or at most 100 nm, or at most 200 nm. However, 116*y* differs from each of 121*y* and 122*y* substantially, e.g., differs by at least 500 nm, or at least 1000 nm, or at least 2000 nm, or at least 4000 nm, or at least 8000 nm, or at least 10000 nm, for example.

Note that as illustrated, the rings 121, 122, 116 are within the ring 112. In an example, the rings 121 and 122 may be formed independent of the ring 116. Accordingly, the rings 121, 122 may or may not be at least in part aligned with the ring 112.

For example, referring now to the example of FIG. 2A, 116*x* is less than each of 121*x* and 122*x*. Thus, a distance (e.g., measured along the X-axis direction) between each of the rings 121, 122 and the edge 208 of the structure 100 is less than a distance (e.g., measured along the X-axis direction) between the ring 116 and the edge 208. Similarly, a distance (e.g., measured along the X-axis direction) between each of the rings 121, 122 and the edge 206 of the structure 100 is less than a distance (e.g., measured along the X-axis direction) between the ring 116 and the edge 206.

Also, in the example of FIG. 2A, a distance (e.g., measured along the Y-axis direction) between the ring 121 and the edge 202 of the structure 100 is less than a distance (e.g., measured along the Y-axis direction) between the ring 116 and the edge 202. Similarly, in the example of FIG. 2A, a distance (e.g., measured along the Y-axis direction) between the ring 122 and the edge 204 of the structure 100 is less than a distance (e.g., measured along the Y-axis direction) between the ring 116 and the edge 204.

Referring now to the example of FIG. 2B, 116*x* is more than each of 121*x* and 122*x*. Thus, a distance (e.g., measured along the X-axis direction) between each of the rings 121, 122 and the edge 208 of the structure 100 is more than a distance (e.g., measured along the X-axis direction) between the ring 116 and the edge 208. Similarly, a distance (e.g., measured along the X-axis direction) between each of the rings 121, 122 and the edge 206 of the structure 100 is more than a distance (e.g., measured along the X-axis direction) between the ring 116 and the edge 206.

Also, in the example of FIG. 2B, a distance (e.g., measured along the Y-axis direction) between the ring 121 and the edge 202 of the structure 100 is more than a distance (e.g., measured along the Y-axis direction) between the ring 116 and the edge 202. Similarly, in the example of FIG. 2B, a distance (e.g., measured along the Y-axis direction) between the ring 122 and the edge 204 of the structure 100 is more than a distance (e.g., measured along the Y-axis direction) between the ring 116 and the edge 204.

Referring now to the example of FIG. 2C, rings 116 and rings 121, 122 are at least in part aligned. Thus, a distance (e.g., measured along the X-axis direction) between each of the rings 121, 122 and the edge 208 of the structure 100 is substantially same as a distance (e.g., measured along the X-axis direction) between the ring 116 and the edge 208. Similarly, a distance (e.g., measured along the X-axis direction) between each of the rings 121, 122 and the edge 206 of the structure 100 is substantially same as distance (e.g., measured along the X-axis direction) between the ring 116 and the edge 206.

Also in the example of FIG. 2C, a distance (e.g., measured along the Y-axis direction) between the ring 121 and the edge 202 of the structure 100 is substantially same as a distance (e.g., measured along the Y-axis direction) between the ring 116 and the edge 202. Similarly, in the example of FIG. 2C, a distance (e.g., measured along the Y-axis direction) between the ring 122 and the edge 204 of the structure 100 is substantially same as a distance (e.g., measured along the Y-axis direction) between the ring 116 and the edge 204.

Referring to FIGS. 1-2C, in an example, the rings 112, 116, 121, 122 act as guard rings of the structure 100. For example, the rings 112, 116, 121, 122 (along with various etch stop layers 425, see FIGS. 4 and 5) are hermitically sealed, so as to protect various devices within the device layer 102 and/or various interconnect feature within the various interconnect layer 108, 109, 111, e.g., from external environment, such as humidity and/or other chemical and/or physical hazards. For example, the rings are formed prior to the die-singulation or dicing process, in which a larger wafer is singulated (e.g., diced) or physical broken down in multiple dies or integrated circuits. The rings are continuous walls of conductive material, such as metal, around internal components of the structure 100, to protect the components from external environment.

A guard ring may comprise a single ring structure along the periphery of the die, and extending vertically within all the interconnect layers and the device layer. However, in the structure 100, multiple such rings are formed, and some rings are specific for specific interconnect layers, e.g., for reasons discussed herein below.

In an example, optical lithography or photolithography may be employed to form at least sections of one or more components within the device layer 102 and one or more (e.g., all) of the interconnect layers 111, 108, 109. For example, optical lithography may be used in an etch process and/or layer formation process. In integrated circuit manufacturing, photolithography or optical lithography is a general term used for techniques that use light to produce minutely patterned thin films of suitable materials over a substrate, such as a silicon wafer, to protect selected areas of the wafer during subsequent etching, deposition, or implantation operations. For example, ultraviolet light is used to transfer a geometric design from an optical mask to a light-sensitive chemical (e.g., photoresist) coated on the substrate. The photoresist either breaks down or hardens where it is exposed to light. The patterned film is then created by removing (e.g., etching) the softer parts of the coating with appropriate solvents.

In optical lithography, a maximum field size that can be printed by a single exposure is determined by a type of illumination source, lens configuration, numerical aperture (NA), resolution of the features within the layer that are to be formed by the photolithography process, and so on.

In an example, high resolution optical lithography process results in smaller and higher resolution feature sizes. In an example, components within the device layer 102 and the interconnect layers 108 may be smaller (e.g., at a higher resolution) than components within the interconnect layers 109, 111. For example, interconnect features within the interconnect layers 108 have lower pitch and smaller size compared to interconnect features within the interconnect layers 109, 111 (e.g., see FIG. 3 herein later). Similarly, devices 130, 132 (e.g., transistors, memory. or other logic semiconductor devices) within the device layer 102 may be smaller in size compared to interconnect features within the interconnect layers 109, 111.

Accordingly, relatively higher resolution optical lithography process may be employed for formation of the relatively high resolution components of the device layer 102 and the interconnect layers 108*a*, . . . , 108*p*. On the other hand, relatively lower resolution optical lithography process may be sufficient to form the relatively low resolution components of the interconnect layers 109*a*, . . . , 109*q* and/or the interconnect layers 111*a*, . . . , 111*r*.

However, the higher resolution optical lithography process may have the cost of smaller printable area. For example, a higher resolution optical lithography process may have a relatively smaller field size limit, and may process relatively smaller area of the wafer during a given lithography process. Thus, an area of the die, which can be processed during a high resolution optical lithography process, is relatively less (e.g., compared to the area processed by a low resolution optical lithography process).

For, for example, referring to FIGS. 1 and 2A-2C, the high resolution optical lithography process may be able to process an area of the device layer 102 and the interconnect layers 108*a*, . . . , 108*p*, which has a X-axis dimension of 121*x* (or 122*x*), and has a Y-axis dimension of 121*y* or 122*y*. Put differently, the high resolution optical lithography process employed for the device layer 102 and the interconnect layers 108 may not be able to process the entire Y-axis dimension of the structure 100.

Thus, if the size of the die exceeds the field dimensional limit of the high resolution optical lithography process, the high resolution optical lithography process for the whole die may be split into two (or more) fields, and the high resolution optical lithography process has to be performed separately for the two or more fields. For example, a first of such two fields is approximately covered by the ring 121 within the device layer 102 and the interconnect layers 108, and a second of such two fields is approximately covered by the ring 122 within the device layer 102 and the interconnect layers 108.

Accordingly, each high resolution optical lithography process on the device layer 102 (as well as individual interconnect layers 108) is performed using two sub-processes: one on the area covered by the ring 121, and another on the area covered by the ring 122. Accordingly, no high resolution optical lithography process may be performed in an area of the corresponding layer that is between the two rings 121, 122.

For example, referring to FIG. 1, the device layer 102 has an area 115*a* between the two rings 121*a* and 122*a*, within which no devices are formed and/or no active conductive structures (such as interconnect features) are formed, e.g., as this area is not exposed to any optical lithography process. Similarly, individual ones of the interconnect layer 108 has an area 115*b* between the two rings 121*b* and 122*b*, within which no active conductive structures (such as interconnect features) are formed. The areas 115*a*, 115*b* may be like an interface or seam region between the two corresponding rings 121, 122. For example, the seam region 115*a* “stiches” the area within the ring 121*a* and the area within the ring 122*a*. No high resolution patterning, including formation of inner rings 121 and/or 122, can be performed within the seam region 115*a*, 115*b*.

Figure 4:
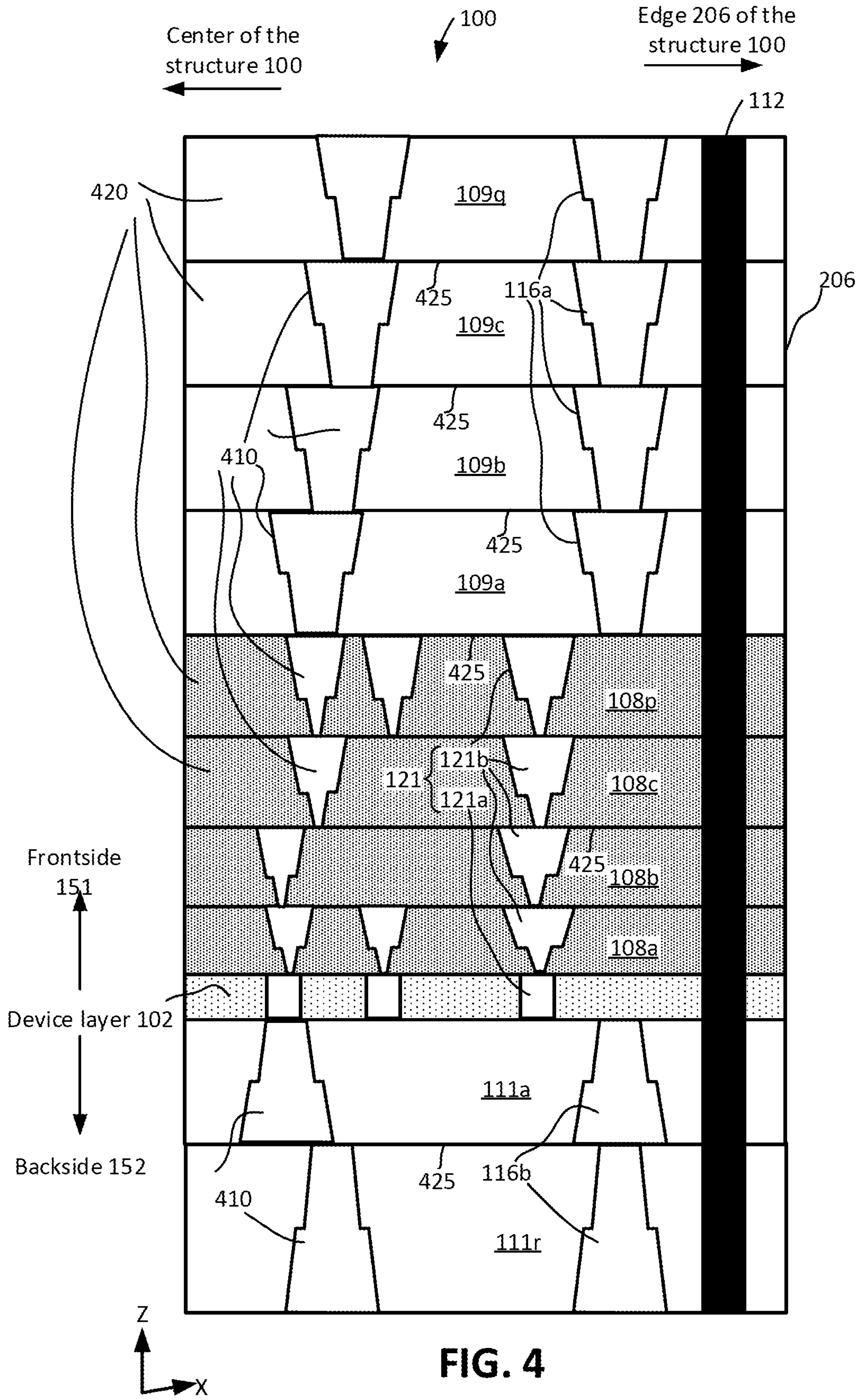
FIGS. 4, 5, 5A, 5B illustrate views of corresponding sections of the structure of FIG. 1, in accordance with an embodiment of the present disclosure.

Note that as discussed herein above, the relatively high resolution features are confined within the device layer 102 and the interconnect layers 108. The interconnect layers 109 and/or 111 may have relatively low resolution features (such as higher pitch interconnect features, as seen in FIG. 4 herein below). Also, a lower resolution optical lithography process may have a relatively bigger field size, and may process relatively greater area of the die during a given lithography process. Thus, in an example, an area of the die, which can be processed during a low resolution optical lithography process, may be relatively more (e.g., compared to the area processed by a high resolution optical lithography process).

Accordingly, when optical lithography processes are being performed within the interconnect layers 109 and/or 111, a single optical lithography process may cover the entire die size. Thus, there is no need for two non-overlapping rings within individual ones of the interconnect layers 109 and 111, as the optical lithography process may cover the entire area of individual interconnect layers. Accordingly, a single ring 116*a* (or 116*b*) may be formed within each such interconnect layer.

Thus, put differently, the device layer and each of the interconnect layers 108*a*, . . . , 108*p* have two non-overlapping rings (e.g., rings 121, 122) formed therewithin, e.g., due to limitations in a corresponding high resolution optical lithography process (as the high resolution optical lithography process doesn’t have sufficient field size to cover the entire area of each such layers, and has to cover the entire area in two passes, thereby resulting in the two non-overlapping rings). In contrast, each of the interconnect layers 109*a*, . . . , 109*q*, 111*a*, . . . , 111*r* has a single ring (e.g., ring 161) covering substantially the entire surface, e.g., as the corresponding low resolution optical lithography process has sufficient field size to cover the entire area of each such layers.

Note that the outer ring 112 is formed after formation of the various layers of the structure 100, and prior to die singulation or dicing process. The outer ring 112 is formed using a low resolution lithography process, which has sufficient field size to cover the entire area of the structure 100. Accordingly, the ring 112 is along a perimeter of the structure, and extends through each of the layers of the structure 100.

Note that the ring 121*a*, along with an upper etch stop layer 425 (see FIGS. 4 and 5) that abuts a top surface of the ring 121*a* and a bottom etch stop layer 425 that abuts a bottom surface of the ring 121*a*, hermitically seals the devices 130 and protects the devices 130 from external environment, as discussed herein above. Similarly, the ring 121*b*, along with an upper etch stop layer 425 that abuts a top surface of the ring 121*a* and a bottom etch stop layer 425 that abuts a bottom surface of the ring 121*b*, hermitically seals the devices 132 and protects the devices 132 from external environment, as discussed herein above. Similarly, each of the rings 121*b*, 122*b*, 116*a*, 116*b* (along with corresponding etch stop layers) protects corresponding components therewithin (such as the ring 121*b* protects one or more interconnect features of the interconnect layers 108, which are within the ring 121*b*).

However, the seam regions 115*a*, 115*b* are not covered by the inner rings 121, 122, 116, where the seam regions 115*a*, 115*b* are formed due to discontinuity between the rings 121, 122. Accordingly, to protect the seam regions 115, the outer ring 112 is employed, which seals the entire die.

Note that the rings 121, 122, 116 protect the corresponding components therewithin, e.g., when the outer ring 112 is being formed. For example, when the outer ring 112 is being formed, the formation process of the outer ring 112 (which extends through all of device and interconnect layers) can damage the devices 130, 132 and/or one or more interconnect features within the interconnect layers 108, 109, 111. In an example, the inner rings 121, 122, 116, thus, protect the corresponding components therewithin, e.g., when the outer ring 112 is being formed.

Figure 3:
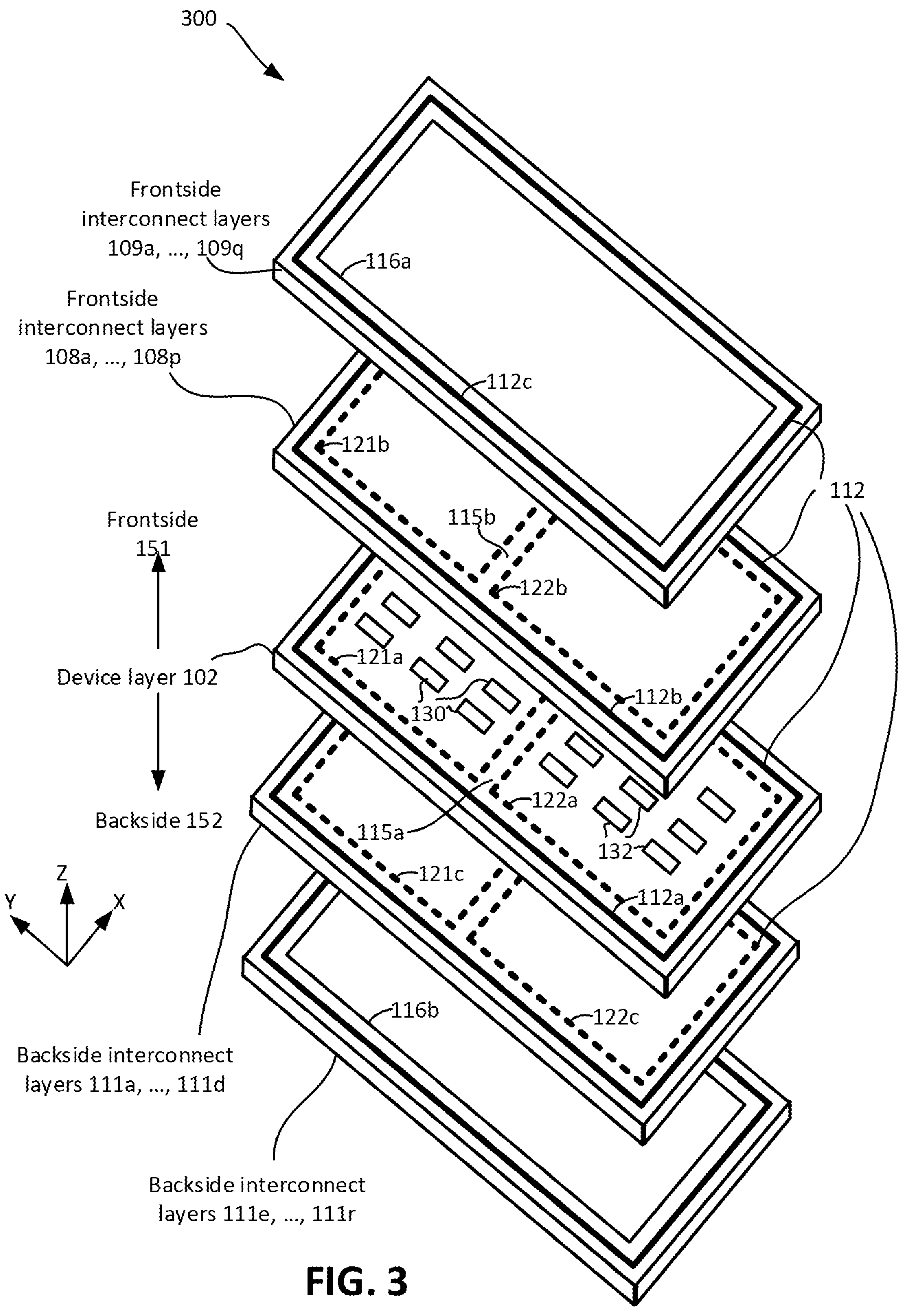
FIG. 3 is an exploded perspective view of an integrated circuit structure that includes two non-overlapping inner rings extending within one or more backside interconnect layers, and includes a single inner ring extending within one or more other backside interconnect layers, in accordance with an embodiment of the present disclosure.

Note that in FIG. 1, each of the backside interconnect layers 111*a*, . . . , 111*r* has a single inner ring 116*b*, e.g., as the pitch size of the interconnect features within such interconnect layers can be relatively large. Hence low resolution lithography process may be employed for forming such backside interconnect layers, where the low resolution lithography process having the bigger field size can cover substantially an entirety of the interconnect layer. However, in another example, one or more of the backside interconnect layers 111*a*, . . . , 111*r* can have sufficiently high resolution, such that a single inner ring 116 cannot be formed to cover substantially an entirety of the corresponding layer. Accordingly, instead of a single inner ring 116*b*, one or more backside interconnect layers 111*a*, . . . , 111*r* can have two non-overlapping inner rings, as illustrated in FIG. 3. FIG. 3 is an exploded perspective view of an integrated circuit structure 300 that includes two non-overlapping inner rings 121*c*, 122*c* extending within one or more backside interconnect layers 111*a*, . . . , 111*d*, and includes a single inner ring 116*b* extending within one or more other backside interconnect layers 111*e*, . . . , 111*r*, in accordance with an embodiment of the present disclosure. Thus, similar to the device layer 102 and the interconnect layers 108*a*, . . . , 108*p*, individual ones of the backside interconnect layers 111*a*, . . . , 111*d* also has two non-overlapping inner rings 121*c*, 122*c*. The structure 300 of FIG. 3 will be apparent, based on the discussion with respect to FIGS. 1-2C.

FIG. 4 illustrates a cross-sectional view of a section of the structure 100 of FIG. 1, in accordance with an embodiment of the present disclosure. The cross-sectional view of FIG. 4 is along line A-A' of FIG. 2A, e.g., along a some-what diagonal cut at a corner of a seam region 115. In FIG. 4, four interconnect layers 109*a*, . . . , 109*q*, four interconnect layers 108*a*, . . . , 108*p*, and two interconnect layers 111*a*, 111*r* are illustrated, however such number of interconnect layers are mere examples.

As illustrated, each of the interconnect layer 108*a*, . . . , 108*p*, 109*a*, . . . , 109*q*, 111*a*, . . . 111*r* comprise a corresponding layer of dielectric material 420, and a corresponding plurality of interconnect features 410 extending within the dielectric material. The interconnect features 410 may be any appropriate interconnect features for conducting power and/or signal of the structure 100. Examples of interconnect features 420 comprise conductive vias and conductive lines. The interconnect features 410 within the frontside interconnect layers 108, 109 are referred to as frontside interconnect features, whereas the interconnect features 410 within the backside interconnect layers 111 are referred to as backside interconnect features. The frontside and backside interconnect features 410, in combination, transmit signals and/or power from and/or to the structure 100.

Adjacent interconnect layers are separated by a corresponding etch stop layer 425. For example, an etch stop layer 425 acts to stop an etch process occurring in an interconnect layer above the etch stop layer 425, e.g., when forming interconnect features within the interconnect layer above the etch stop layer 425. In an example, an etch stop layer 425 may also act as a hermetic seal between two corresponding interconnect layers.

In FIG. 4, illustrated in thick black block is the outer ring 112, which extends along a perimeter of the structure 100. For example, a section of the ring 112 along the edge 206 (see line A'A' of FIG. 2A) of the structure 100 is illustrated in FIG. 4. As illustrated, the ring 112 extends vertically within all interconnect layers 109, 108, 111 and the device layer 102 of the structure 100.

Note that in an example, one or more (e.g., all) of the rings discussed may not be used to conduct signals and/or powers, and the rings comprising conductive material may be electrically floating. Accordingly, none of the rings 116, 121, 122 are coupled to any of the interconnect features 410.

Also illustrated is the ring 116*a* extending though the interconnect layers 109*a*, . . . , 109*q*. For example, the ring 116*a* comprises conductive interconnect features spanning in a continuous loop (see the perspective view of FIG. 1 for the loop), as discussed herein above. Note that the interconnect features 410 are also conductive vias and lines that extend in a vertical or horizontal direction, but are not arranged in any continuous loop. In contrast, the ring 116*a* is, for example, a continuous wall of conductive material arranged in a continuous loop.

Similarly, the ring 121*b* extends within the interconnect layers 108*a*, . . . , 108*p*, the ring 121*a* extends within the device layer 102, and the ring 116*b* extends within the interconnect layers 111*a*, . . . , 111*r*. Note that the rings 122*a*, 122*b* are not visible in the cross-sectional view of FIG. 4, which is the cross-sectional view along line A-A' of FIG. 2A.

Figure 5:
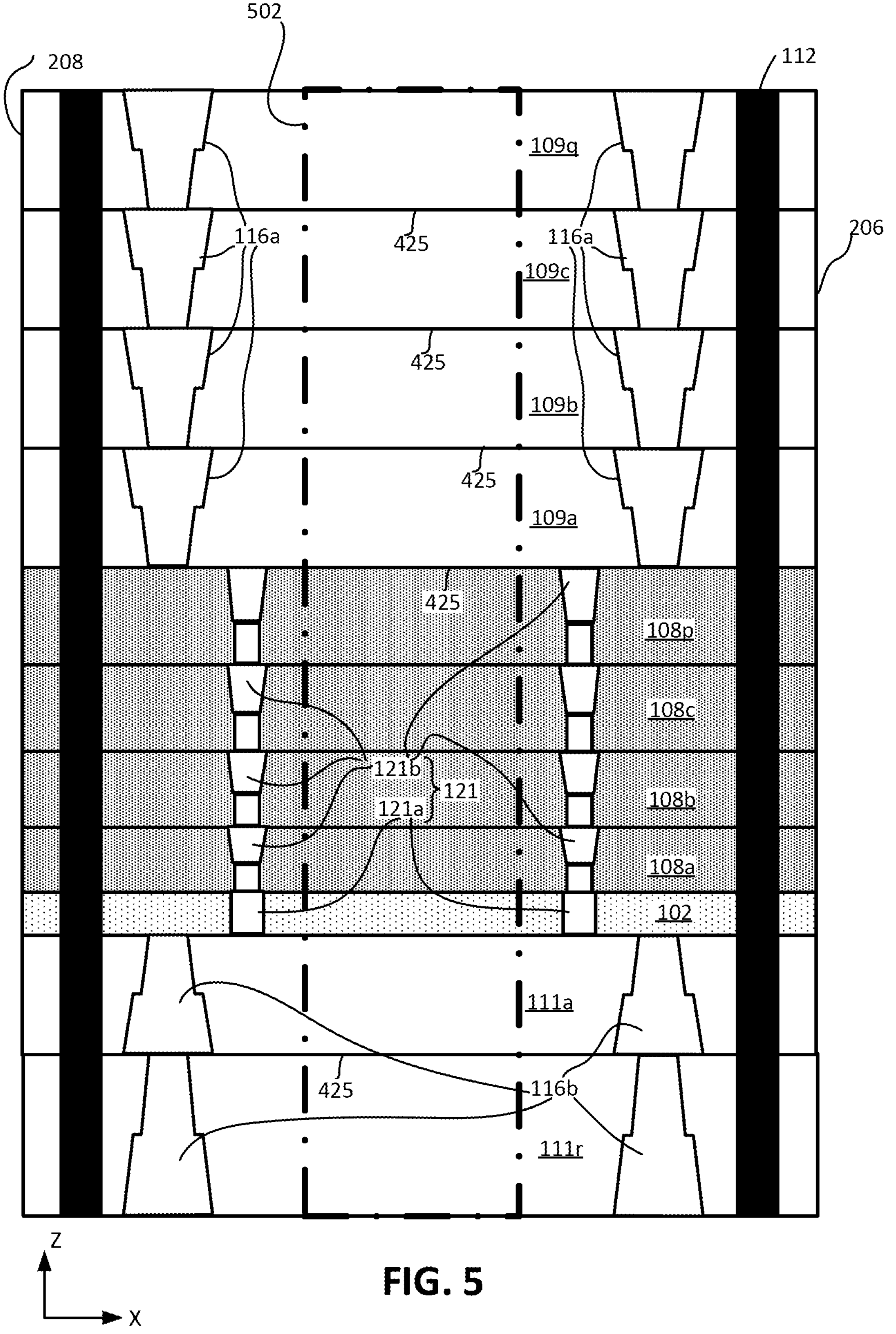

FIG. 5 illustrates a cross-sectional view of another section of the structure 100 of FIG. 1, in accordance with an embodiment of the present disclosure. The cross-sectional view of FIG. 5 is along line B-B' of FIG. 2B.

In FIG. 5, illustrated is the ring 112 along the edges 206 and 208 of structure 100 (see also FIG. 2B). Also illustrated is the ring 116*a* along the edges 206 and 208 of structure 100 and extending within the interconnect layers 109*a*, . . . , 109*q*. Also illustrated is the ring 121*a* along the edges 206 and 208 of structure 100 and extending within the device layer 102. Also illustrated is the ring 121*b* along the edges 206 and 208 of structure 100 and extending within the interconnect layers 108*a*, . . . , 108*p*. Also illustrated is the ring 116*b* along the edges 206 and 208 of structure 100 and extending within the interconnect layers 111*a*, . . . , 111*r*.

A dotted box 502 is also illustrated in FIG. 5. The box symbolically represents various devices 130 within the device layer 102 (note that the devices 132 would not be visible in FIG. 5, also see FIG. 2B), and various interconnect features (such as interconnect features 410 discussed with respect to FIG. 4) extending within various interconnect layers 108, 109, 111.

Figure 5A:
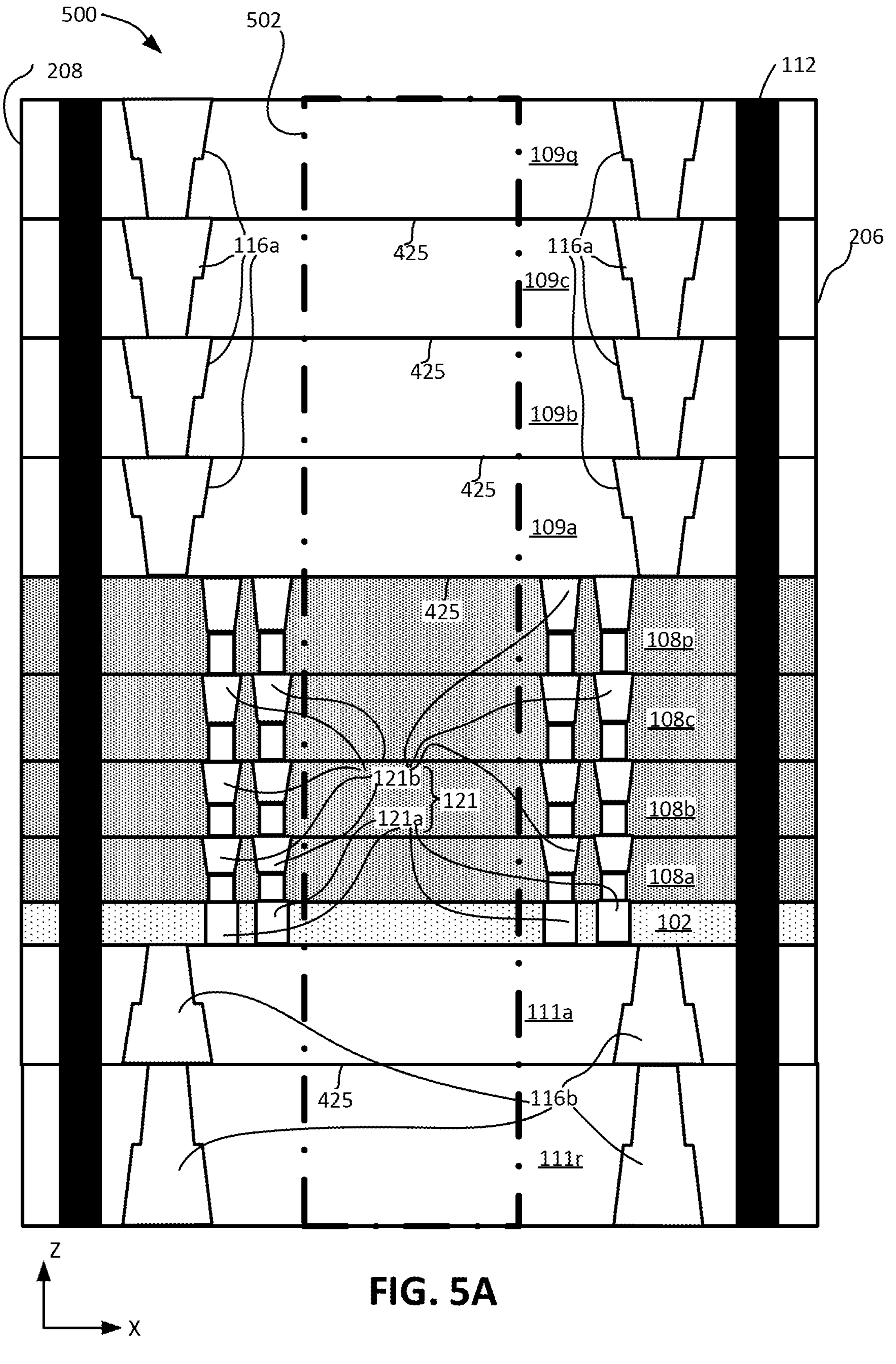
Figure 5B:
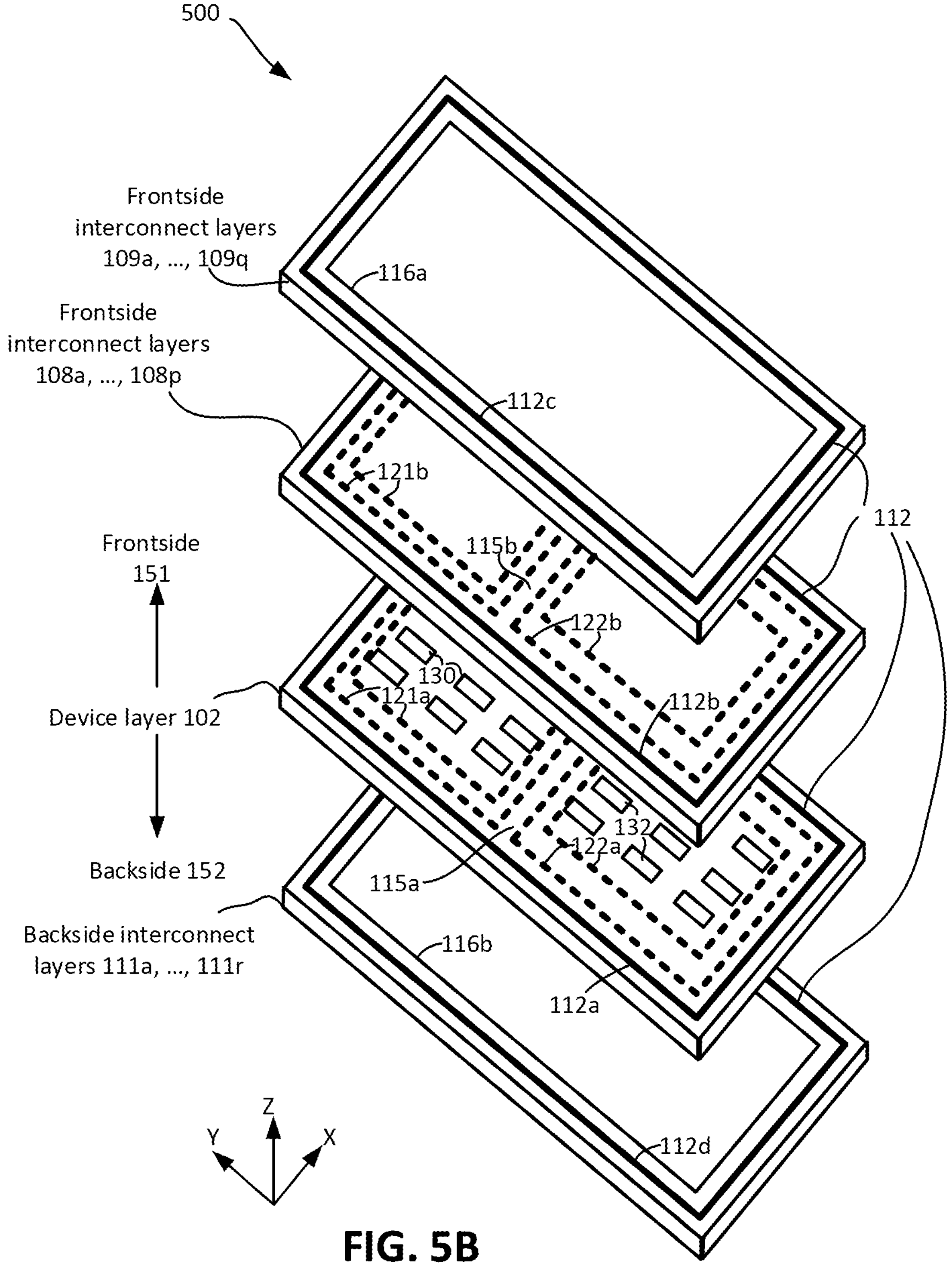

FIGS. 5A and 5B illustrate various view of another integrated circuit structure 500, which has more than one inner ring in one or more interconnect layers, in accordance with an embodiment of the present disclosure. The cross-sectional view of FIG. 5A is similar to that of FIG. 5, and the exploded perspective view of FIG. 5B is similar to that of FIG. 1. In an example, the structure 500 has multiple tracks of each of the inner rings 121, 122. For example, there are two tiers or concentric circles or tracks for each of the inner rings 121*a* and 121*b*, as illustrated in FIGS. 5A and 5B. For example, the multiple tracks provide better hermitic protection of components within the corresponding rings.

Figure 6:
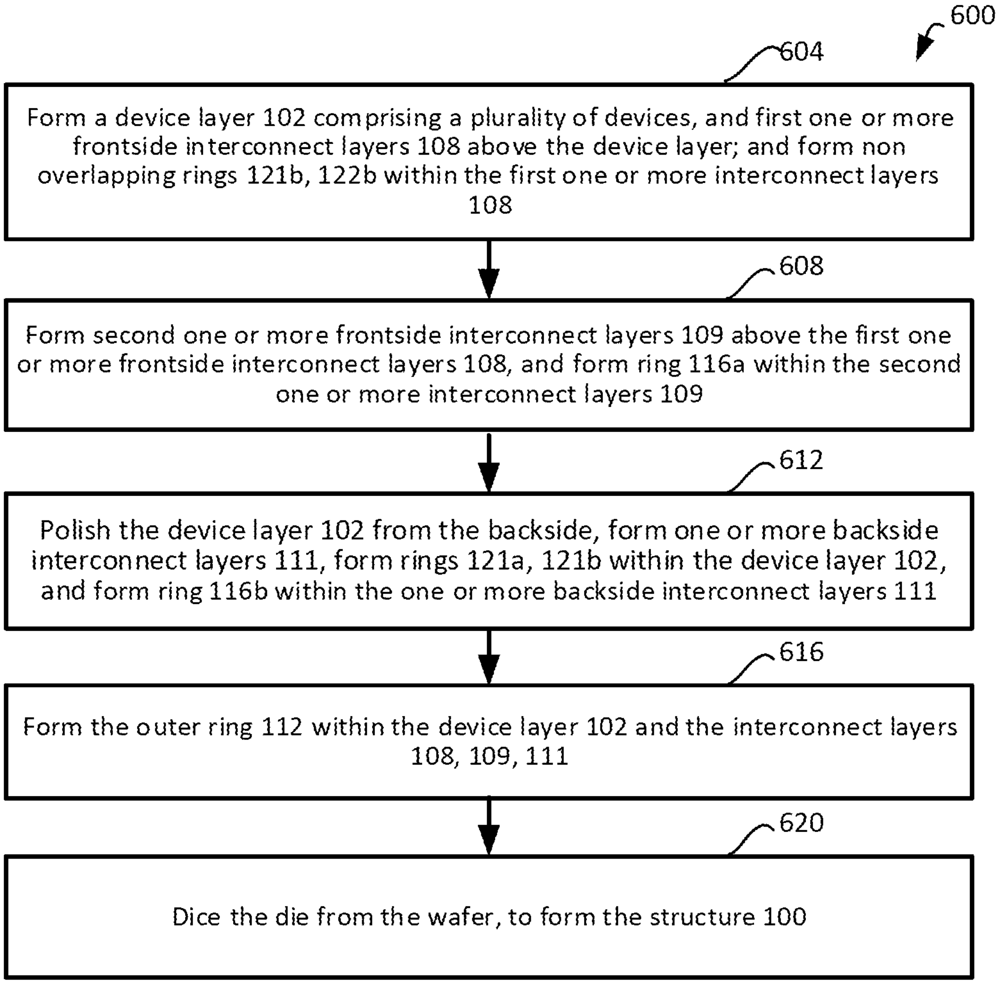
FIG. 6 illustrate a flowchart depicting a method of forming the example integrated circuit structure of FIGS. 1-5, in accordance with an embodiment of the present disclosure.

FIG. 6 illustrate a flowchart depicting a method 600 of forming the example integrated circuit structure of FIGS. 1-5, in accordance with an embodiment of the present disclosure. FIGS. 7A, 7A1, 7B, 7B1, 7C, 7C1, 7D, 7E, 7E1, 7F, and 7G collectively illustrate an example integrated circuit structure (e.g., the integrated circuit structure 100 of FIGS. 1-5) in various stages of processing in accordance with the methodology 600 of FIG. 6, in accordance with an embodiment of the present disclosure. FIGS. 6 and 7A-7G will be discussed in unison. The cross-sectional views of FIGS. 7A, 7B, 7C, 7D, 7E, 7F, and 7G correspond to the cross-sectional view of FIG. 5, e.g., along line B-B' of FIG. 2B. FIGS. 7A1, 7B1, 7C1, and 7E1 are exploded perspective views (e.g., similar to FIG. 1).

Referring to FIG. 6, the method 600 includes, at 604, forming a device layer 102 comprising a plurality of devices, and first one or more frontside interconnect layers 108 (e.g., interconnect layer 108*a*, . . . , 108*p*) above the device layer 102; and forming non overlapping rings 121*b*, 122*b* within the interconnect layers 108, e.g., as illustrated in FIGS. 7A and 7A1. Note that similar to FIG. 5, the dotted box 502 in FIG. 7A symbolically represents various devices 130 within the device layer 102 (not that the devices 132 would not be visible in the cross-sectional view of FIG. 7A, also see FIG. 2B), and various interconnect features (such as interconnect features 410 discussed with respect to FIG. 4) extending within various interconnect layers. Also note that in the cross-sectional view of FIG. 7A, the ring 121*b* is visible, and the ring 122*b* is not visible. In an example, the device layer 102 and the interconnect layers 108 are formed using appropriate techniques for forming such layers in an integrated circuit. The rings 121*b*, 122*b* are formed using appropriate techniques for forming a continuous wall or line of conductive interconnect features. Note that the rings 121*b*, 122*b* are confined within the interconnect layers 108, and the rings 121*a*, 122*a* within the device layer 102 may not yet be formed, in an example. FIG. 7A1 illustrates an exploded perspective view of the integrated circuit structure of FIG. 7A.

In an example, during first one or more optical lithography processes, the devices 130 are formed; and during second one or more optical lithography processes, the devices 132 are formed within the device layer 102. Put differently, higher resolution optical lithography processes used for the device layer 102 and the interconnect layers 108 may have a relatively smaller field size limit, and may process relatively smaller area of the die during a given lithography process. Accordingly, different optical lithography processes may be used for devices 130 and 132. Similarly, different optical lithography processes may be used for the ring 121*b* and interconnect features therewithin, and for the ring 122*b* and interconnect features therewithin. As discussed herein above, the seam regions 115*a*, 115*b* may not have any conductive structures, as the seam regions 115*a*, 115*b* may not be exposed to the optical lithography processes.

Figure 7B:
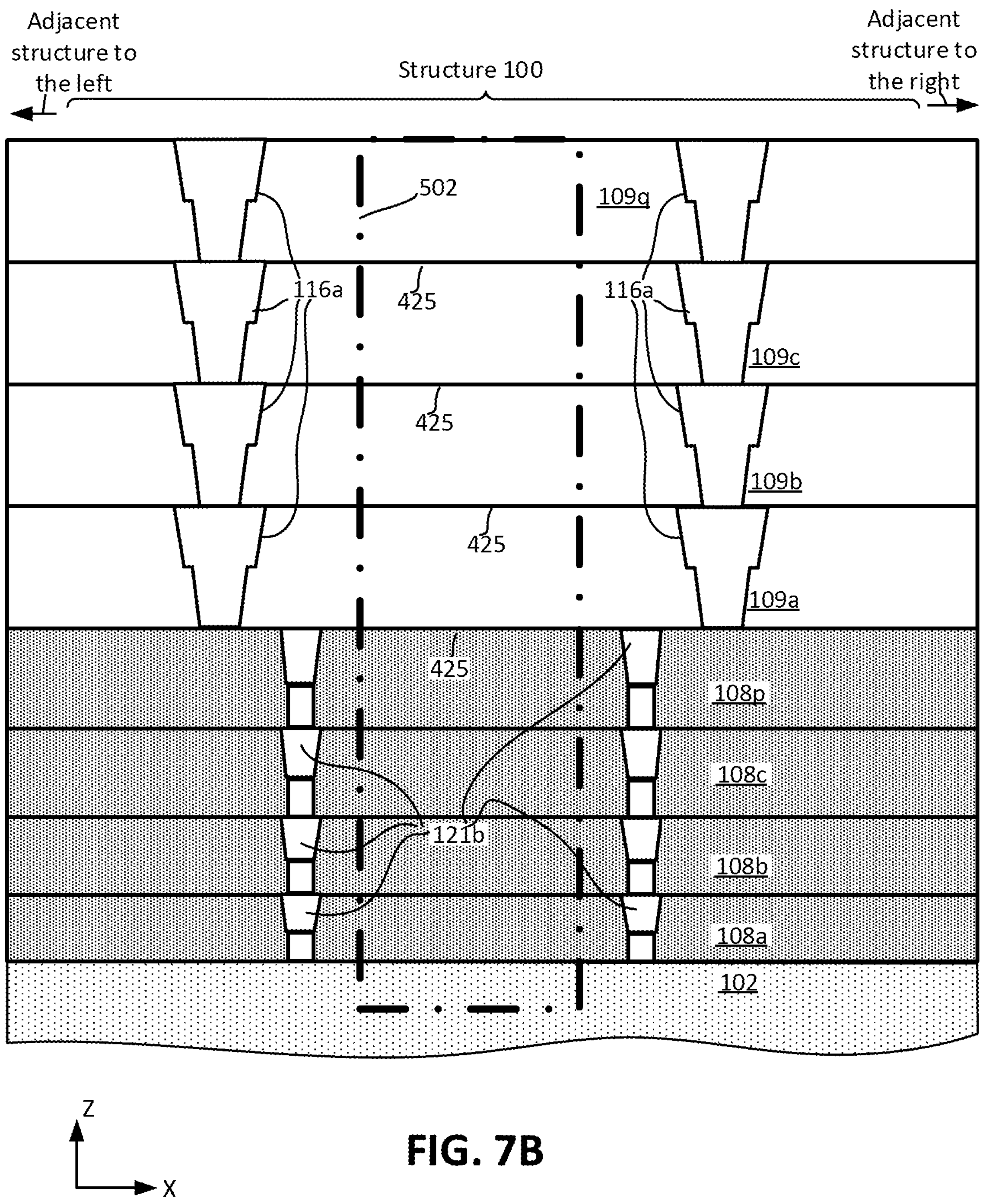

Note that in FIGS. 7A and 7A1 (and also in subsequent FIGS. 7B-7E), the structure 100 has not yet been singulated or diced, to cut out the die of the structure 100 from the wafer. Thus, the structure 100 in these figures is still attached to adjacent neighboring structures. For example, in the cross sectional views of FIGS. 7A, 7B, 7C, 7D, and 7E, sections of neighboring structures on the left and right sides of the structure are illustrated. Note that in the exploded views of FIGS. 7A1, 7B1, 7C1, and 7E1, only the structure 100 (and not any neighboring structures) is illustrated.

The method 600 then proceeds from 604 to 608. At 608, second one or more frontside interconnect layers 109 are formed above the first one or more frontside interconnect layers 108, and the ring 116*a* is formed within the interconnect layers 109, as illustrated in FIG. 7B. FIG. 7B1 illustrates an exploded perspective view of the integrated circuit structure of FIG. 7B. Note that FIG. 7B corresponds to the alignment of the rings of FIG. 2B, where 121*x*, 122*x* is smaller than 116*x*. However, in other examples, the alignment of any of FIG. 2A or 2C (or other appropriate arrangement) may also be possible. In an example, the interconnect layer 109 are formed using appropriate techniques for forming such layers in an integrated circuit. The ring 116*a* is formed using appropriate techniques for forming a continuous wall or line of conductive interconnect features within one or more interconnect layers.

Figure 7C:
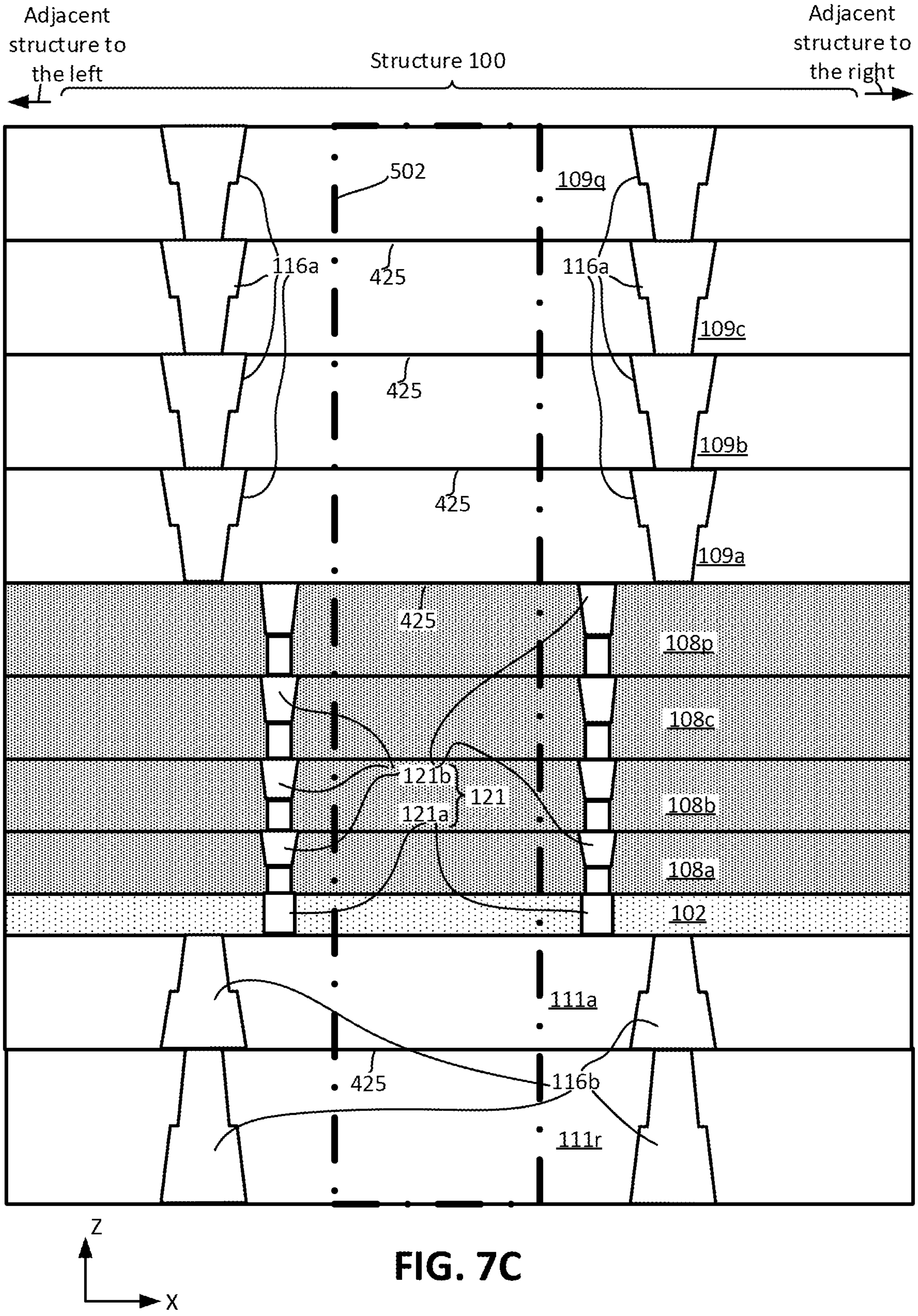

The method 600 then proceeds from 608 to 612. At 612, the device layer 102 is polished from the backside, rings 121*a*, 121*b* within the device layer 102 is formed, and one or more backside interconnect layers 111 and the ring 116*b* within the backside interconnect layers 111 are formed, e.g., as illustrated in FIGS. 7C and 7C1. For example, the integrated circuit structure is flipped upside down (although the flipping is not illustrated in FIG. 7C, and the integrated circuit structure is shown in its original orientation), and the backside of the integrated circuit chip is processed from the top. Polishing the device layer 102 may include polishing a substrate on which the devices of the device layer are formed, which may reduce the height of the substrate, or may even remove the substrate. In an example, reducing the height of the substrate and/or removing the substrate facilitates in forming the backside interconnect layers 111. The backside interconnect layers 111 are formed using appropriate techniques for forming such layers in an integrated circuit. The ring 116*b* is formed using appropriate techniques for forming a continuous wall or line of conductive interconnect features within one or more interconnect layers.

Note that in the example method 600 of FIG. 6 and in FIGS. 7C and 7C1, the rings 121*a*, 122*a* within the device layer 102 are formed from the backside, e.g., during the process 612. However, in another example, the rings 121*a*, 122*a* within the device layer 102 may be formed from the frontside, e.g., during the process 604 of the method 600.

Figure 7D:
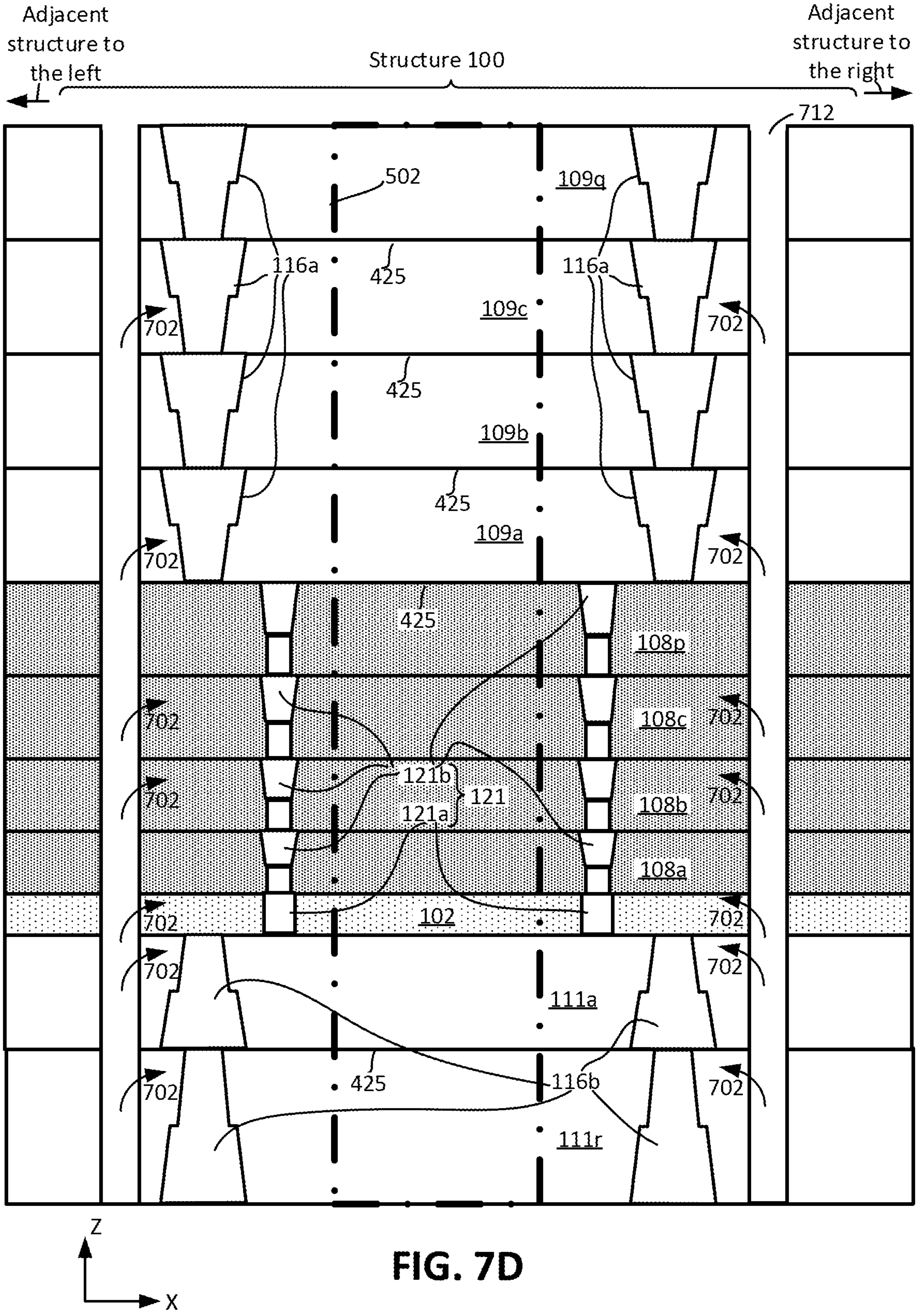
Figure 7E:
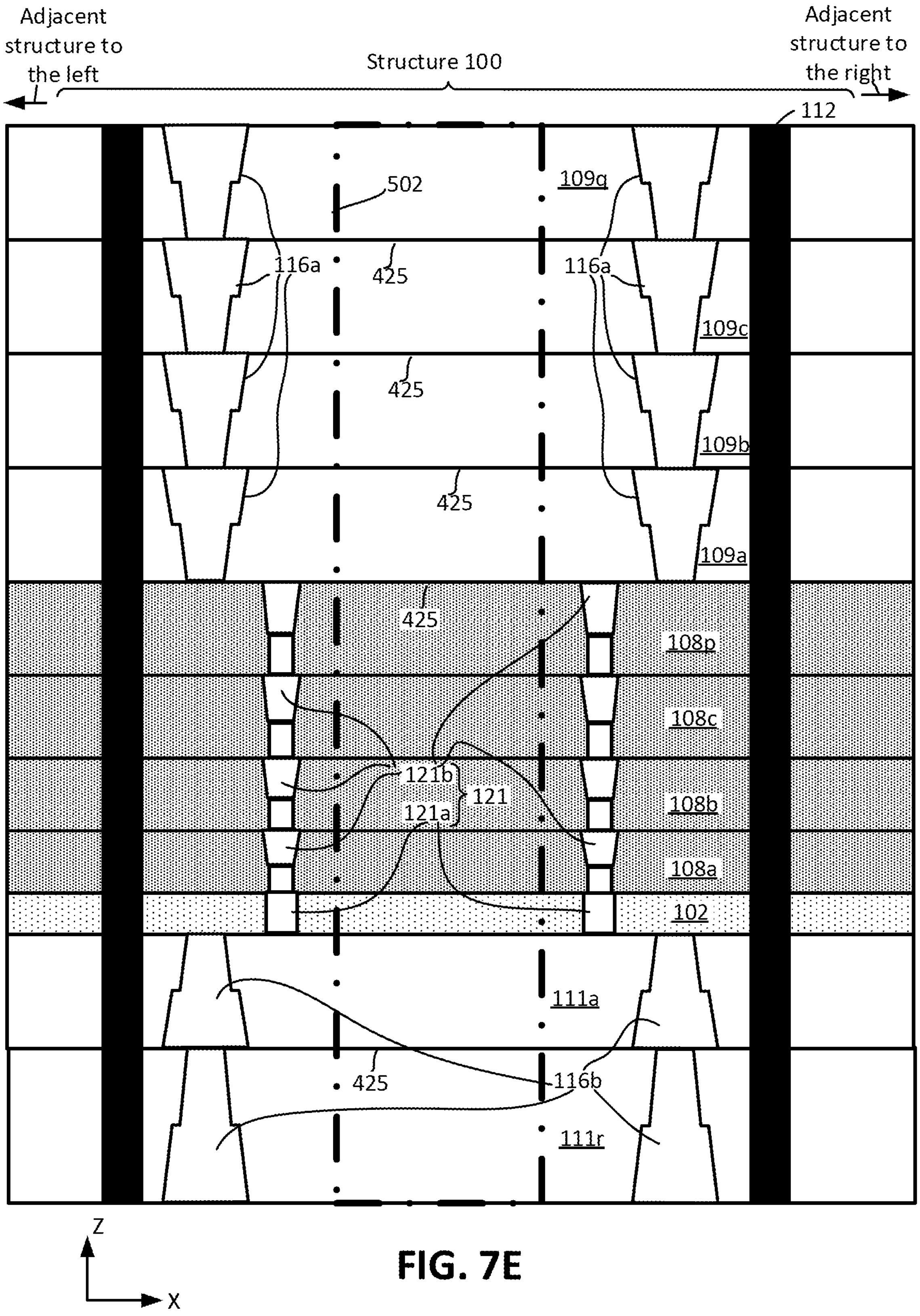
Figure 7F:
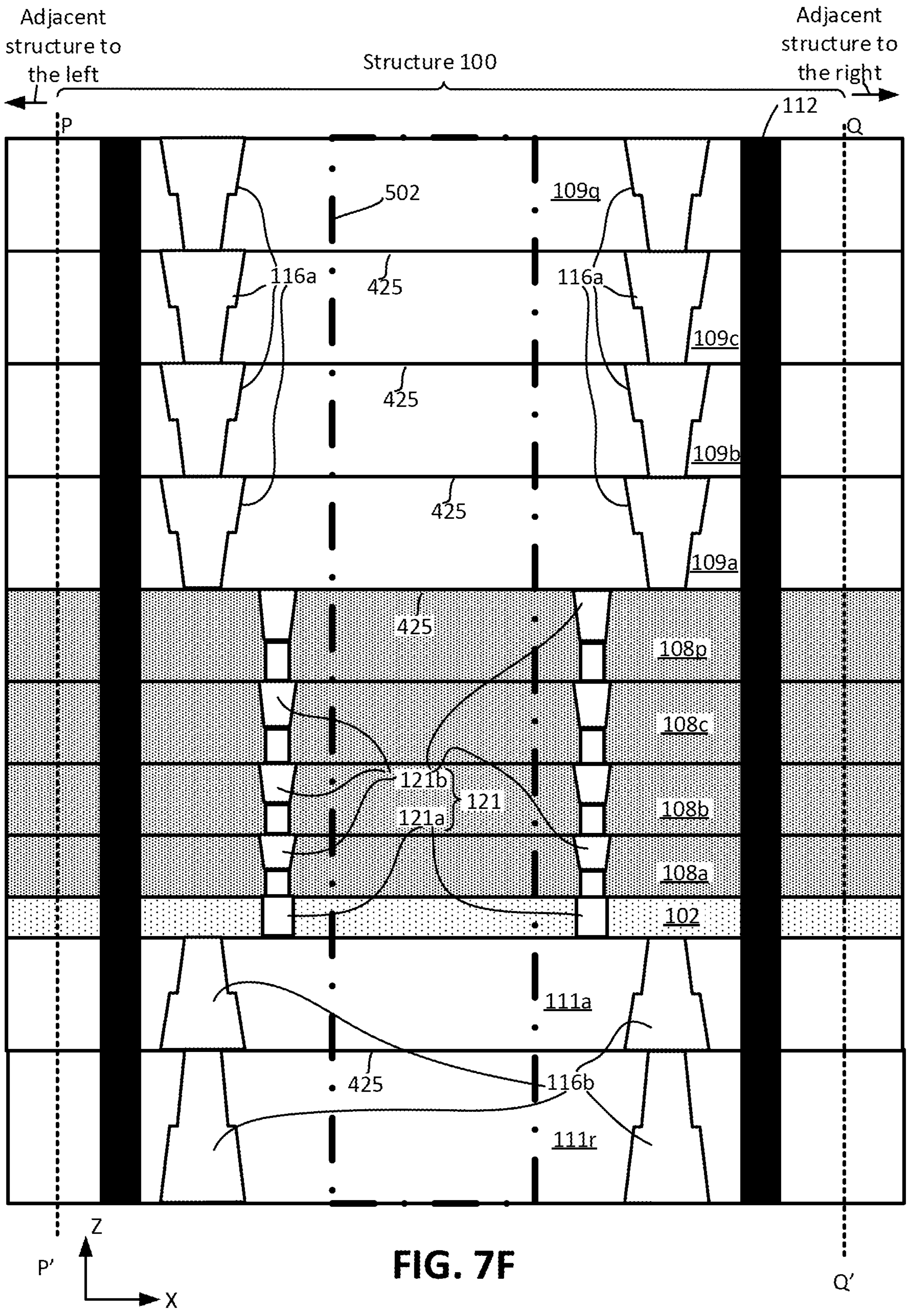

The method 600 then proceeds from 612 to 616. At 616, the outer ring 112 within the device layer 102 and the interconnect layers 108, 109, 111 are formed, as illustrated in FIGS. 7D, 7E, and 7E1. For example, FIG. 7D illustrates forming a trench 712 for the outer ring 112, where the trench 712 is along a perimeter of the structure 100. Subsequently, the trench 712 is filled with conductive material, to form the outer ring 112, as illustrated in FIGS. 7E and 7E1. Examples of the conductive material include one or more metals and/or alloys thereof, such as copper, ruthenium, molybdenum, tungsten, aluminum, an alloy such as copper-tin (CuSn), copper indium (CuIn), copper-antimony (CuSb), copper-bismuth (CuBi), copper-rhenium (CuRe), and/or any other suitable conductive material.

Arrows 702 in FIG. 7D schematically illustrates humidity and/or chemical elements that can enter the structure 100, during formation of the trench 712 and/or during deposition of the conductive material within the trench 712 during formation of the outer ring 112. However, the inner rings 116, 121, and 122 prevents or reduces propagation of such unwanted humidity and/or chemicals within the dotted box 502 representing one or more devices and/or interconnect features of the structure 100. Thus, the inner rings 116, 121, 122 protects the devices and/or interconnect features of the structure 100, e.g., during formation of the outer ring 112, in an example.

Figure 7G:
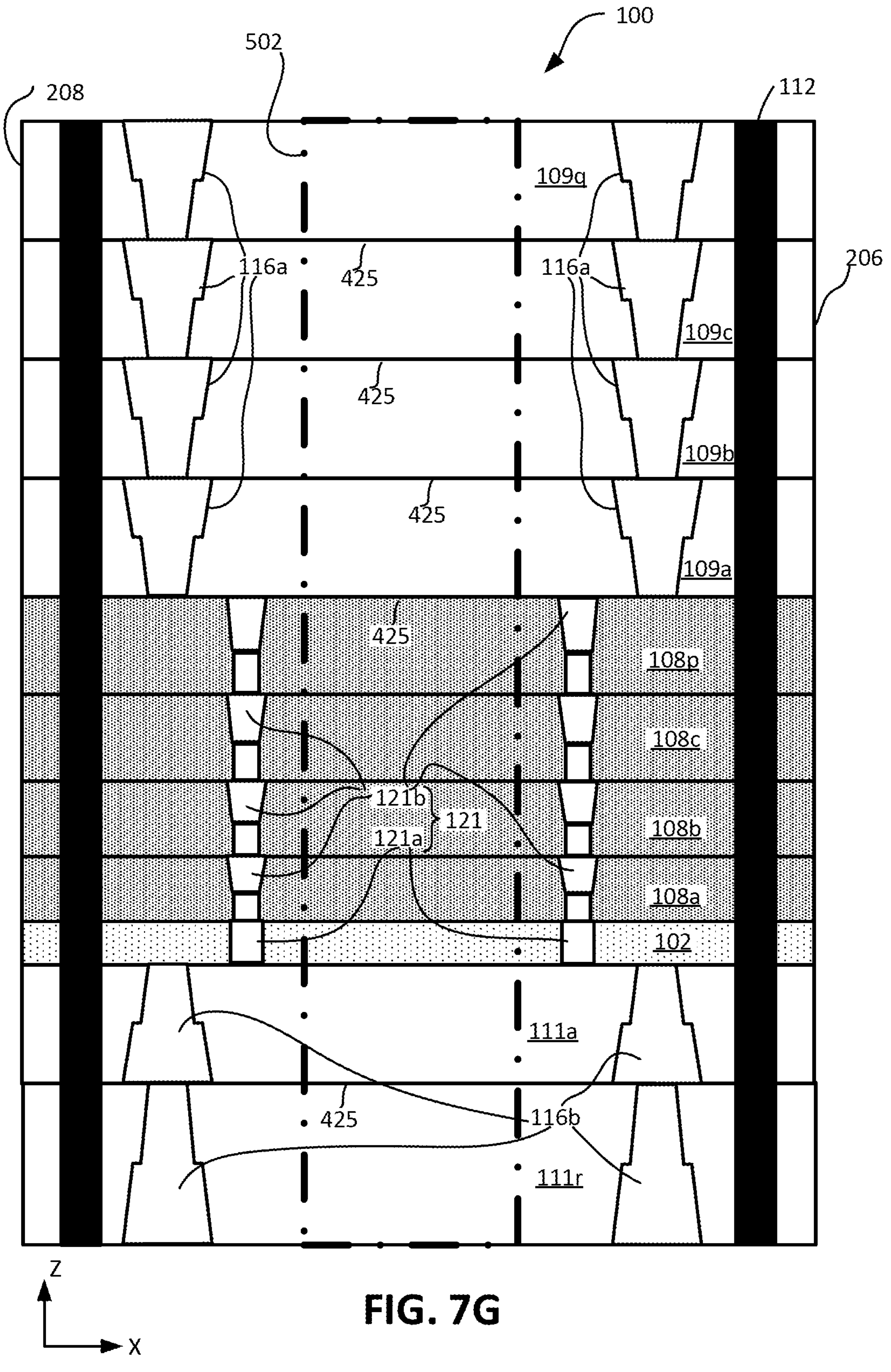

The method 600 then proceeds from 616 to 620. At 620, the die is diced or singulated from the wafer, to form the structure 100. For example, referring to FIG. 7F, the die is diced along line P-P', to form the edge 208 of the structure 100 of FIG. 7G. Similarly, the die is diced along line Q-Q', to form the edge 206 of the structure 100 of FIG. 7G. Although not illustrated in FIGS. 7F and 7G, the die is also diced from two other sides, to respectively form the edges 202 and 204 (e.g., see FIGS. 2A-2C). Thus, FIG. 7G illustrates the structure 100 after dicing of the die from the wafer.

Note that the processes in method 600 are shown in a particular order for ease of description. However, one or more of the processes may be performed in a different order or may not be performed at all (and thus be optional), in accordance with some embodiments. Numerous variations on method 600 and the techniques described herein will be apparent in light of this disclosure.

Example System

Figure 8:
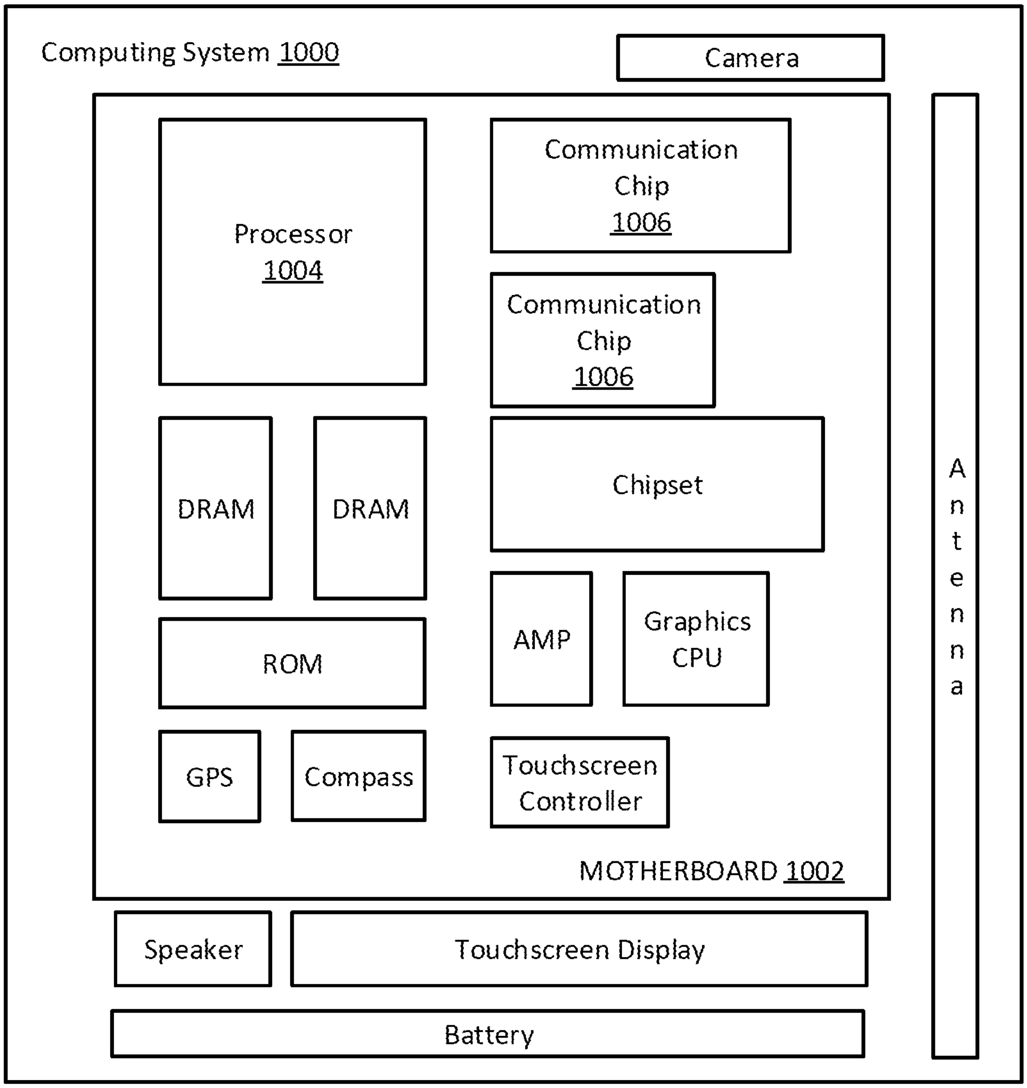
FIG. 8 illustrates a computing system implemented with integrated circuit structures (such as the integrated circuit structures illustrated in FIGS. 1-5B) formed using the techniques disclosed herein, in accordance with some embodiments of the present disclosure.

FIG. 8 illustrates a computing system 1000 implemented with integrated circuit structures (such as the integrated circuit structures illustrated in FIGS. 1-5) formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1. An integrated circuit structure, comprising: a device layer including a first set of devices and a second set of devices; an interconnect layer above the device layer, the interconnect layer comprising one or more conductive interconnect features within dielectric material; and a first ring structure comprising conductive material extending within the interconnect layer, and a second ring structure comprising conductive material extending within the interconnect layer, the second ring structure non-overlapping with the first ring structure; wherein the first ring structure is above the first set of devices of the device layer, and the second ring structure is above the second set of devices of the device layer.

Example 2. The integrated circuit structure of example 1, wherein the interconnect layer is a first interconnect layer, and wherein the integrated circuit structure further comprises: a second interconnect layer above the first interconnect layer; and a third ring structure comprising conductive material extending within the second interconnect layer; wherein the third ring structure is above the first set of devices and the second set of devices of the device layer.

Example 3. The integrated circuit structure of example 2, wherein the third ring structure is above at least a part of each of the first ring structure and the second ring structure.

Example 4. The integrated circuit structure of any of examples 2-3, further comprising: a fourth ring structure comprising conductive material extending through both the first and second interconnect layers, wherein the fourth ring wraps around (i) the first and second ring structures within the first interconnect layer, and (ii) the third ring structure within the second interconnect layer.

Example 5. The integrated circuit structure of example 4, wherein the fourth ring structure also extends through the device layer.

Example 6. The integrated circuit structure of example 5, further comprising: an upper etch stop layer that abuts the top surface of the fourth ring structure, and a lower etch stop layer that abuts the bottom surface of the fourth ring structure, wherein the fourth ring structure, along with the upper and lower etch stop layers, hermitically seals the first and second set of devices from environment external to the integrated circuit structure.

Example 7. The integrated circuit structure of any of examples 1-6, wherein each of the first and second ring structures is a continuous ring of a metal.

Example 8. The integrated circuit structure of any of examples 1-7, wherein each of the first and second ring structures also extends within the device layer.

Example 9. The integrated circuit structure of example 8, wherein: a portion of the first ring structure, which extends within the device layer, wraps around the first set of devices; and a portion of the second ring structure, which extends within the device layer, wraps around the second set of devices.

Example 10. The integrated circuit structure of example 9, wherein: a section of the device layer, which is between (i) the portion of the first ring structure extending within the device layer and (ii) the portion of the second ring structure extending within the device layer, lacks any device and/or conductive features to transmit signal or power.

Example 11. The integrated circuit structure of any of examples 1-10, wherein: a section of the interconnect layer, which is between the first ring structure and the second ring structure, lacks any conductive features to transmit signal or power.

Example 12. The integrated circuit structure of any of examples 1-11, wherein each of the first ring structure and the second ring structure comprises a metal.

Example 13. The integrated circuit structure of any of examples 1-12, wherein each of the first ring structure and the second ring structure comprises copper.

Example 14. The integrated circuit structure of any of examples 1-13, wherein the interconnect layer is a first interconnect layer, and wherein the integrated circuit structure further comprises: a second interconnect layer below the device layer; and a third ring structure comprising conductive material extending within the second interconnect layer; wherein the third ring structure is below the first set of devices and the second set of devices of the device layer.

Example 15. The integrated circuit structure of example 14, wherein the first interconnect layer is on a frontside of the device layer, and the second interconnect layer is on a backside of the device layer.

Example 16. An integrated circuit structure, comprising: a device layer including a set of devices; an interconnect layer above the device layer, the interconnect layer comprising one or more conductive interconnect features within dielectric material; a first ring structure comprising conductive material extending within the interconnect layer, the first ring structure not extending within the device layer, the first ring structure above the set of devices; and a second ring structure comprising conductive material extending within the interconnect layer and the device layer.

Example 17. The integrated circuit structure of example 16, wherein a section of the second ring structure, which extends within the device layer, wraps around the set of devices.

Example 18. The integrated circuit structure of any of examples 16-17, wherein a section of the second ring structure, which extends within the interconnect layer, wraps around the first ring structure.

Example 19. The integrated circuit structure of any of examples 16-18, wherein the interconnect layer is a first interconnect layer, and wherein the integrated circuit structure further comprises: a second interconnect layer between the device layer and the first interconnect layer; and a third ring structure comprising conductive material extending within the second interconnect layer, and a fourth ring structure comprising conductive material extending within the second interconnect layer, the third ring structure non-overlapping with the fourth ring structure.

Example 20. The integrated circuit structure of example 19, wherein: the second ring structure extends within the second interconnect layer; and a section of the second ring structure, which extends within the second interconnect layer, wraps around each of the third ring structure and the fourth ring structure.

Example 21. The integrated circuit structure of any of examples 19-20, wherein: the set of devices comprises a first plurality of devices and a second plurality of devices; and the third ring structure is above the first plurality of devices and the fourth ring structure is above the second plurality of devices.

Example 22. The integrated circuit structure of any of examples 19-21, wherein: each of the third ring structure and the fourth ring structure extends within the device layer; and a section of the device layer, which is between (i) the portion of the third ring structure extending within the device layer and (ii) the portion of the fourth ring structure extending within the device layer, lacks any device and/or conductive features to transmit signal or power.

Example 23. The integrated circuit structure of any of examples 19-22, wherein: a section of the second interconnect layer, which is between the third ring structure and the fourth ring structure, lacks any interconnect feature for transmitting conductive signals and/or power.

Example 24. An integrated circuit structure, comprising: a device layer including a set of devices; a frontside interconnect layer above the device layer, and a backside interconnect layer below the device layer, each interconnect layer comprising one or more corresponding conductive interconnect features within dielectric material; a first ring structure comprising conductive material extending within the backside interconnect layer, without extending within the device layer or the frontside interconnect layer; and a second ring structure comprising conductive material extending through each of the backside interconnect layer, the device layer, and the frontside interconnect layer, wherein the second ring structure wraps around the first ring structure.

Example 25. The integrated circuit structure of example 24, further comprising: a third ring structure and a fourth ring structure each extending within the device layer and the frontside interconnect layer, and not extending within the backside interconnect layer; wherein the third ring structure and a fourth ring structure are non-overlapping ring structures comprising conductive material.

Example 26. The integrated circuit structure of example 25, wherein the second rings structure wraps around each of the third ring structure and the fourth ring structure.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit structure, comprising:

a device layer including a first set of devices and a second set of devices;

an interconnect layer above the device layer, the interconnect layer comprising one or more conductive interconnect features within dielectric material; and a first ring structure comprising conductive material extending within the interconnect layer, and a second ring structure comprising conductive material extending within the interconnect layer, the second ring structure non-overlapping with the first ring structure;

wherein the first ring structure is above the first set of devices of the device layer, and the second ring structure is above the second set of devices of the device layer, and wherein each of the first and second ring structures also extends through the device layer.

2. The integrated circuit structure of claim 1, wherein the interconnect layer is a first interconnect layer, and wherein the integrated circuit structure further comprises:

a second interconnect layer above the first interconnect layer; and a third ring structure comprising conductive material extending within the second interconnect layer;

wherein the third ring structure is above the first set of devices and the second set of devices of the device layer.

3. The integrated circuit structure of claim 2, wherein the third ring structure is above at least a part of each of the first ring structure and the second ring structure.

4. The integrated circuit structure of claim 2, further comprising:

a fourth ring structure comprising conductive material extending through both the first and second interconnect layers, wherein the fourth ring structure wraps around (i) the first and second ring structures within the first interconnect layer, and (ii) the third ring structure within the second interconnect layer.

5. The integrated circuit structure of claim 4, wherein the fourth ring structure also extends through the device layer.

6. The integrated circuit structure of claim 5, further comprising:

an upper etch stop layer that abuts the top surface of the fourth ring structure, and a lower etch stop layer that abuts the bottom surface of the fourth ring structure, wherein the fourth ring structure, along with the upper and lower etch stop layers, hermitically seals the first and second set of devices from environment external to the integrated circuit structure.

7. The integrated circuit structure of claim 1, wherein each of the first and second ring structures is a continuous ring of a metal.

8. The integrated circuit structure of claim 1, wherein:

a portion of the first ring structure, which extends through the device layer, wraps around the first set of devices; and a portion of the second ring structure, which extends through the device layer, wraps around the second set of devices.

9. The integrated circuit structure of claim 8, wherein:

a section of the device layer, which is between (i) the portion of the first ring structure extending through the device layer and (ii) the portion of the second ring structure extending through the device layer, lacks any device and/or conductive features to transmit signal or power.

10. The integrated circuit structure of claim 1, wherein:

a section of the interconnect layer, which is between the first ring structure and the second ring structure, lacks any conductive features to transmit signal or power.

11. The integrated circuit structure of claim 1, wherein each of the first ring structure and the second ring structure comprises a metal.

12. The integrated circuit structure of claim 1, wherein the interconnect layer is a first interconnect layer, and wherein the integrated circuit structure further comprises:

a second interconnect layer below the device layer; and a third ring structure comprising conductive material extending within the second interconnect layer;

wherein the third ring structure is below the first set of devices and the second set of devices of the device layer.

13. An integrated circuit structure, comprising:

a device layer including a set of devices;

an interconnect layer above the device layer, the interconnect layer comprising one or more conductive interconnect features within dielectric material;

a first ring structure comprising conductive material extending within the interconnect layer, the first ring structure not extending within the device layer, the first ring structure above the set of devices; and a second ring structure comprising conductive material extending within the interconnect layer and the device layer.

14. The integrated circuit structure of claim 13, wherein a section of the second ring structure, which extends within the device layer, wraps around the set of devices.

15. The integrated circuit structure of claim 13, wherein a section of the second ring structure, which extends within the interconnect layer, wraps around the first ring structure.

16. The integrated circuit structure of claim 13, wherein the interconnect layer is a first interconnect layer, and wherein the integrated circuit structure further comprises:

a second interconnect layer between the device layer and the first interconnect layer; and a third ring structure comprising conductive material extending within the second interconnect layer, and a fourth ring structure comprising conductive material extending within the second interconnect layer, the third ring structure non-overlapping with the fourth ring structure.

17. An integrated circuit structure, comprising:

a device layer including a set of devices;

a frontside interconnect layer above the device layer, and a backside interconnect layer below the device layer, each interconnect layer comprising one or more corresponding conductive interconnect features within dielectric material;

a first ring structure comprising conductive material extending within the backside interconnect layer, without extending within the device layer or the frontside interconnect layer; and a second ring structure comprising conductive material extending through each of the backside interconnect layer, the device layer, and the frontside interconnect layer, wherein the second ring structure wraps around the first ring structure.

18. The integrated circuit structure of claim 17, further comprising:

a third ring structure and a fourth ring structure each extending within the device layer and the frontside interconnect layer, and not extending within the backside interconnect layer;

wherein the third ring structure and the fourth ring structure are non-overlapping ring structures comprising conductive material.

19. The integrated circuit structure of claim 18, wherein the second ring structure wraps around each of the third ring structure and the fourth ring structure.

20. The integrated circuit structure of claim 12, further comprising:

a fourth ring structure comprising conductive material extending through each of the first interconnect layer, the device layer, and the second interconnect layer, wherein the fourth ring structure wraps around the first, second, and third ring structures.

* * * * *